United States Patent
Davis et al.

(10) Patent No.: US 12,500,197 B2
(45) Date of Patent: Dec. 16, 2025

(54) ENCAPSULANT-DEFINED LAND GRID ARRAY (LGA) PACKAGE AND METHOD FOR MAKING THE SAME

(71) Applicant: Deca Technologies USA, Inc., Tempe, AZ (US)

(72) Inventors: Robin Davis, Vancouver, WA (US); Craig Bishop, Scottsdale, AZ (US); Paul R. Hoffman, San Diego, CA (US); Clifford Sandstrom, Richfield, MN (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 18/389,741

(22) Filed: Dec. 19, 2023

(65) Prior Publication Data

US 2024/0213202 A1    Jun. 27, 2024

Related U.S. Application Data

(60) Provisional application No. 63/435,211, filed on Dec. 23, 2022.

(51) Int. Cl.
| | | |
|---|---|---|
| *H01L 21/56* | (2006.01) | |
| *H01L 23/00* | (2006.01) | |
| *H01L 23/31* | (2006.01) | |

(52) U.S. Cl.
CPC ............ *H01L 24/19* (2013.01); *H01L 21/568* (2013.01); *H01L 24/20* (2013.01);
(Continued)

(58) Field of Classification Search
None
See application file for complete search history.

(56) References Cited

U.S. PATENT DOCUMENTS

| | | |
|---|---|---|
| 5,570,274 A | 10/1996 | Saito |
| 5,790,384 A | 8/1998 | Ahmad |
| (Continued) | | |

FOREIGN PATENT DOCUMENTS

| | | |
|---|---|---|
| CN | 104253105 | 12/2014 |
| CN | 212136437 U | 12/2020 |
| (Continued) | | |

OTHER PUBLICATIONS

Anandan, Ramasamy et al. "Embedded Wafer Level BGA (EWLB)—Extra-Small and ELGA Packages." Electronics Packaging Technology Conference (EPTC), 2011. pp. 412-416.
(Continued)

*Primary Examiner* — Jay C Chang
(74) *Attorney, Agent, or Firm* — Booth Udall, PLC; Kenneth C. Booth

(57) ABSTRACT

A method and related structure for a encapsulant defined land grid array (LGA) may comprise a semiconductor chip comprising conductive studs disposed over an active layer of the semiconductor chip, and a first encapsulant disposed around at least a portion of sidewalls of the conductive studs. A surface of the first encapsulant and conductive studs may be planarized. Conductive traces may be disposed over the encapsulant and coupled with the conductive studs. A dielectric layer may be disposed adjacent the conductive traces. LGA pads may be coupled with the conductive traces. A second encapsulant may be disposed over the dielectric layer and the LGA pads. A planar surface may be formed comprising the second encapsulant around the LGA pads and attachment areas on or over the LGA pads. The plurality of attachment areas may be coplanar or recessed the planar surface.

22 Claims, 19 Drawing Sheets

(52) U.S. Cl.
CPC ...... *H01L 23/3135* (2013.01); *H01L 23/3192* (2013.01); *H01L 2224/19* (2013.01); *H01L 2224/2105* (2013.01); *H01L 2224/214* (2013.01); *H01L 2224/215* (2013.01); *H01L 2924/01013* (2013.01); *H01L 2924/01022* (2013.01); *H01L 2924/01028* (2013.01); *H01L 2924/01029* (2013.01); *H01L 2924/01046* (2013.01); *H01L 2924/01047* (2013.01); *H01L 2924/0105* (2013.01); *H01L 2924/01074* (2013.01); *H01L 2924/01079* (2013.01)

(56) References Cited

U.S. PATENT DOCUMENTS

| | | |
|---|---|---|
| 6,121,065 A | 9/2000 | Wong |
| 6,133,626 A | 10/2000 | Hawke |
| 6,294,406 B1 | 9/2001 | Bertin |
| 7,456,496 B2 | 11/2008 | Hwee |
| 7,476,980 B2 | 1/2009 | Rebibis |
| 7,569,422 B2 | 8/2009 | Lin |
| 7,829,380 B2 | 11/2010 | Irsigler |
| 8,018,036 B2 | 9/2011 | Goh |
| 8,030,770 B1 | 10/2011 | Juskey |
| 8,164,171 B2 | 4/2012 | Lin |
| 8,487,435 B2 | 7/2013 | Juskey |
| 8,503,186 B2 | 8/2013 | Lin |
| 8,653,647 B2 | 2/2014 | Masuda |
| 8,664,044 B2 | 3/2014 | Jin |
| 8,804,360 B2 | 8/2014 | Lin |
| 8,860,207 B2 | 10/2014 | Jin |
| 9,196,509 B2 | 11/2015 | Scanlan |
| 9,355,945 B1 | 5/2016 | Ge |
| 9,368,438 B2 | 6/2016 | Lin |
| 9,385,074 B2 | 7/2016 | Pendse |
| 9,391,041 B2 | 7/2016 | Lin |
| 9,553,000 B2 | 1/2017 | Yu |
| 9,601,463 B2 | 3/2017 | Yu |
| 9,613,931 B2 | 4/2017 | Lin |
| 9,685,390 B2 | 6/2017 | Hu |
| 9,704,735 B2 | 7/2017 | Konchady |
| 9,793,231 B2 | 10/2017 | Chen |
| 9,831,170 B2 | 11/2017 | Scanlan |
| 10,056,351 B2 | 8/2018 | Yu |
| 10,229,892 B2 | 3/2019 | Appelt |
| 10,325,879 B2 | 6/2019 | Yu |
| 10,373,902 B2 | 8/2019 | Scanlan |
| 10,490,468 B2 | 11/2019 | Tsai |
| 10,510,721 B2 | 12/2019 | Bhagavat |
| 10,593,620 B2 | 3/2020 | Agarwal |
| 10,770,416 B2 | 9/2020 | Kim |
| 10,879,224 B2 | 12/2020 | Chen |
| 10,886,263 B2 | 1/2021 | Chen |
| 11,024,605 B2 | 6/2021 | Chen |
| 11,056,453 B2 | 7/2021 | Olson |
| 11,171,076 B2 | 11/2021 | Yu |
| 11,211,360 B2 | 12/2021 | Huang |
| 11,276,656 B2 | 3/2022 | Chen |
| 11,502,062 B2 | 11/2022 | Chen |
| 2003/0122246 A1 | 7/2003 | Lin |
| 2007/0278701 A1 | 12/2007 | Chang |
| 2008/0038874 A1* | 2/2008 | Lin ........................ H01L 23/293 438/118 |
| 2009/0212428 A1 | 8/2009 | Yang |
| 2010/0290191 A1 | 11/2010 | Lin |
| 2011/0156239 A1 | 6/2011 | Jin |
| 2011/0202896 A1 | 8/2011 | Scanlan |
| 2011/0210442 A1 | 9/2011 | Lim |
| 2011/0285007 A1 | 11/2011 | Chi |
| 2012/0038061 A1 | 2/2012 | Su |
| 2012/0153493 A1 | 6/2012 | Lee |
| 2012/0228754 A1 | 9/2012 | Liu |
| 2013/0075894 A1 | 3/2013 | Gallegos |
| 2013/0075924 A1 | 3/2013 | Lin |
| 2013/0168830 A1 | 7/2013 | Uehling |
| 2014/0102772 A1 | 4/2014 | Chen |
| 2014/0124937 A1* | 5/2014 | Wu ........................ H01L 24/81 257/772 |
| 2014/0335658 A1* | 11/2014 | Scanlan ................. H01L 24/96 438/113 |
| 2015/0249856 A1 | 9/2015 | Pereira |
| 2015/0380386 A1 | 12/2015 | Vincent |
| 2016/0005705 A1 | 1/2016 | Masumoto |
| 2016/0064334 A1 | 3/2016 | Bishop |
| 2016/0254229 A1 | 9/2016 | Yu |
| 2017/0148755 A1 | 5/2017 | Scanlan |
| 2018/0019221 A1 | 1/2018 | Appelt |
| 2018/0082911 A1 | 3/2018 | Bishop |
| 2018/0102311 A1 | 4/2018 | Shih |
| 2018/0130761 A1 | 5/2018 | Kim |
| 2018/0366423 A1 | 12/2018 | Ong |
| 2019/0027450 A1 | 1/2019 | Choi |
| 2019/0221520 A1 | 7/2019 | Kim |
| 2019/0259718 A1 | 8/2019 | Choi |
| 2019/0304938 A1* | 10/2019 | Hadizadeh ............. H01L 24/24 |
| 2019/0326257 A1 | 10/2019 | Agarwal |
| 2019/0333893 A1 | 10/2019 | Yu |
| 2019/0341351 A1 | 11/2019 | May |
| 2020/0029435 A1 | 1/2020 | Baek |
| 2020/0043853 A1 | 2/2020 | Kim |
| 2020/0058627 A1 | 2/2020 | Chen |
| 2020/0194330 A1 | 6/2020 | Ramanathan |
| 2020/0219815 A1 | 7/2020 | Elsherbini |
| 2020/0266184 A1 | 8/2020 | Pietambaram |
| 2020/0294923 A1 | 9/2020 | Bhagavat |
| 2020/0328161 A1 | 10/2020 | Lin |
| 2020/0350272 A1 | 11/2020 | Hong |
| 2020/0402941 A1 | 12/2020 | Olson |
| 2020/0403299 A1 | 12/2020 | Gupta |
| 2020/0409859 A1 | 12/2020 | Saleh |
| 2020/0411397 A1 | 12/2020 | Han |
| 2020/0411443 A1 | 12/2020 | Guo |
| 2021/0066263 A1 | 3/2021 | Chen |
| 2021/0366854 A1 | 11/2021 | Yu |
| 2021/0366877 A1 | 11/2021 | Wu |
| 2022/0005760 A1 | 1/2022 | Dadvand |
| 2022/0262742 A1 | 8/2022 | Hou |
| 2022/0352106 A1 | 11/2022 | Sandstrom |
| 2023/0163112 A1 | 5/2023 | We |
| 2023/0275047 A1 | 8/2023 | Chen |
| 2024/0213135 A1 | 6/2024 | Olson |

FOREIGN PATENT DOCUMENTS

| | | |
|---|---|---|
| CN | 112234035 A | 1/2021 |
| CN | 116544181 | 8/2023 |
| JP | 2018032750 | 3/2018 |
| KR | 20150009668 | 1/2015 |
| KR | 1020150009668 | 1/2015 |
| KR | 1020160123959 | 10/2016 |
| KR | 20210148855 | 12/2021 |
| KR | 20230037608 X | 3/2023 |
| TW | I261901 B | 9/2006 |
| TW | 201413845 | 4/2014 |
| TW | 202205600 A | 2/2022 |
| TW | 202234636 A | 9/2022 |
| WO | 2020263952 | 12/2020 |

OTHER PUBLICATIONS

Boettcher, Lars et al. Next Generation System in a Package Manufacturing by Embedded Chip Technologies. Additional Conferences (Device Packaging, HiTEC, HiTEN, & CICMT). 2010.

Boettcher, Lars et al. "Embedding of Chips for System in Package Realization—Technology and Applications." 2008. pp. 383-386.

Braun, Tanja et al. "Fan-Out Wafer and Panel Level Packaging as Packaging Platform for Heterogeneous Integration." Micromachines. 2019. vol. 10, pp. 342.

Jin, Yonggang et al. "Development and Characterization of Next Generation EWLB Embedded Wafer Level BGA) Packaging." ECTC, 2012. pp. 1388-1393.

(56) References Cited

OTHER PUBLICATIONS

Jin, Yonggang et al. "Enhanced Fan-Out WLP for High Power Device Packaging." International Electronics Manufacturing Technology Conference (IEMT), 2012.

Kurita, Yoichiro et al. "Fan-Out WLP With Highly Flexible Design Capabilities." 3rd Electronic System-Integration Technology Conference (ESTC), Sep. 13-16, 2010.

Ma, Yiyi et al. "Thermal Cycling Reliability Assessment and Enhancement of Embedded Wafer Level LGA Packages for Power Applications." Electronic Packaging Technology Conference (EPTC), 2012. pp. 606-611.

Motohasi, N., et al. System in Wafer Level Package Technology with RDL first process, 2011 Electronic Components and Technology Conferencepp 59-64.

Stahr, Hannes et al. "Embedded Components on the Way to Industrialisation." 2011. https://ats.het/wp-content/uploads/2017/03/SMTA_Austin_TX_2011_ECP_Paper.pdf.

* cited by examiner

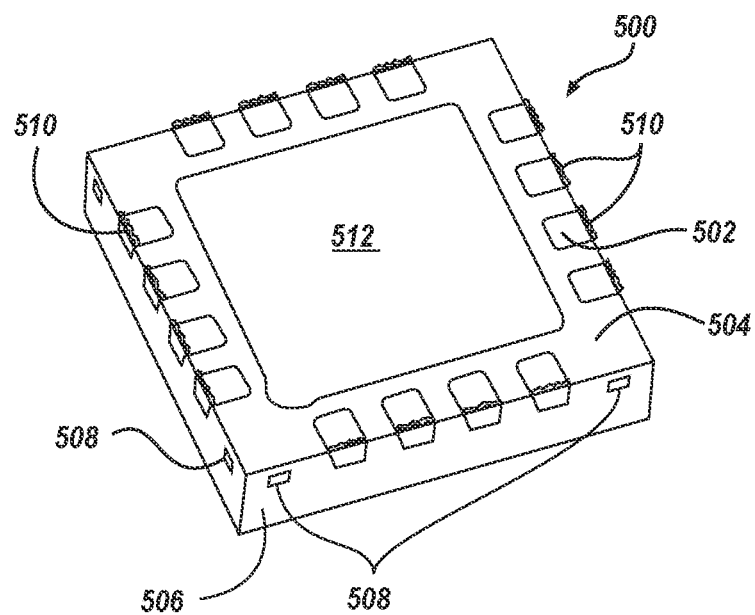
*FIG. 1A - Prior Art*
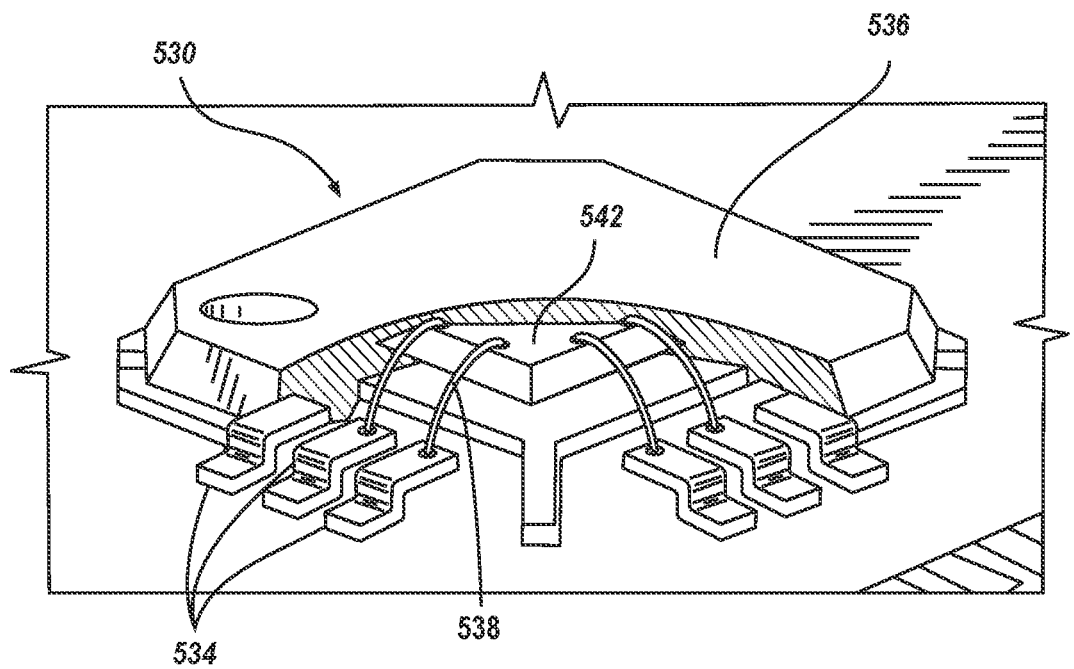
*FIG. 1B - Prior Art*

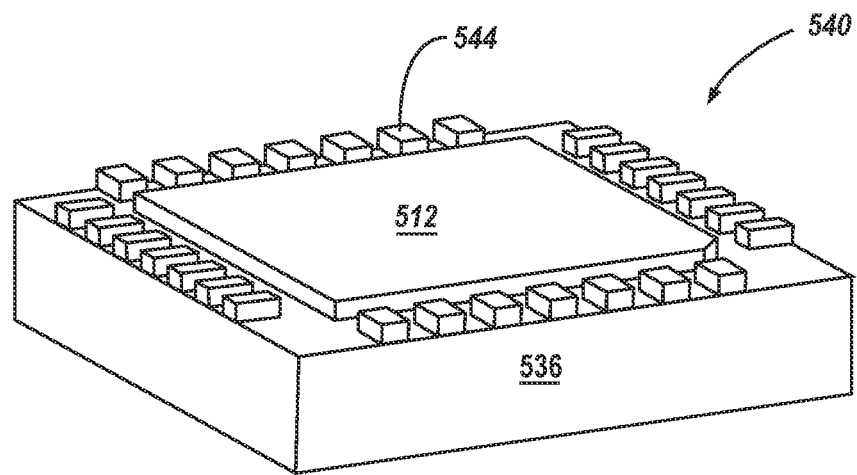
FIG. 1C - Prior Art
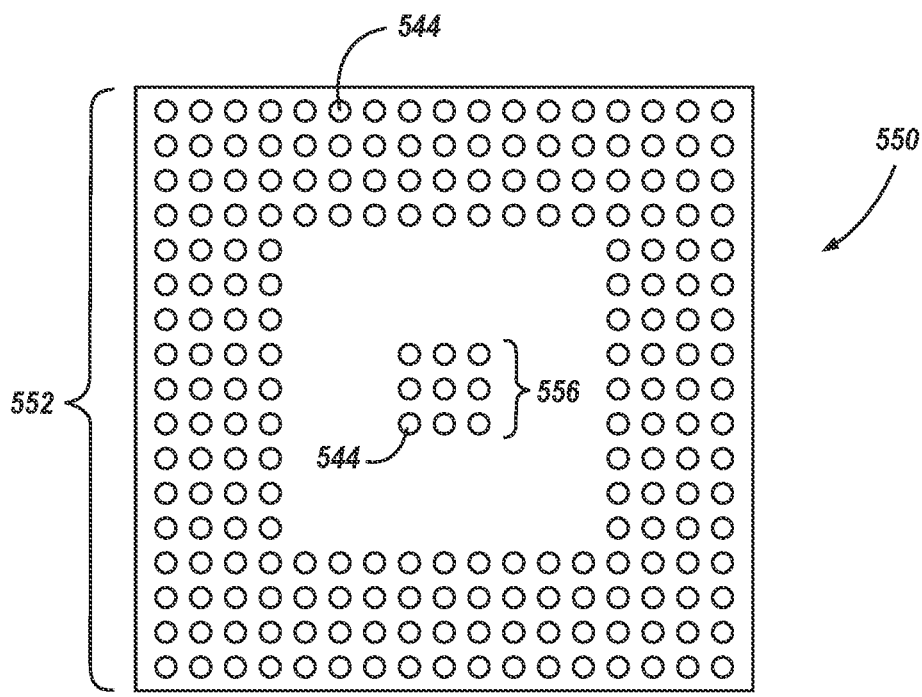
FIG. 1D - Prior Art

ENCAPSULANT-DEFINED LAND GRID ARRAY (LGA) PACKAGE AND METHOD FOR MAKING THE SAME

CROSS-REFERENCE TO RELATED APPLICATIONS

This application claims the benefit of U.S. Provisional Application No. 63/435,211, entitled "Encapsulant-Defined Land Grid Array (LGA) Package and Method for Making the Same," which was filed Dec. 23, 2022, the entire disclosure of which is hereby incorporated herein by this reference.

INCORPORATION BY REFERENCE

This disclosure hereby incorporates by reference the entirety of the disclosures of: (i) U.S. Patent Application No. 63/347,516 entitled "Molded Direct Contact Interconnect Build-Up Structure Without Capture Pads" to Davis et al. that was filed on May 31, 2022; (ii) U.S. patent application Ser. No. 13/891,006, titled "Semiconductor Device and Method of Adaptive Patterning for Panelized Packaging," filed May 9, 2013, and issued as U.S. Pat. No. 9,196,509; and (iii) U.S. patent application Ser. No. 13/893,117, titled "Adaptive Patterning for Panelized Packaging," filed May 13, 2013, and issued as U.S. Pat. No. 8,826,221.

TECHNICAL FIELD

Embodiments of the present disclosure relate to the field of devices and methods of forming an electronic assembly or semiconductor assembly, such as quad flat no-lead (QFN), dual flat no-lead (DFN) or small-outline no-lead (SON) semiconductor packaging without a leadframe, as well as LGA packages, BGA packages, and other "no-lead" packages, each of which may comprise encapsulant-defined pads such as LGA pads or BGA pads. The embodiments may be made with or without molded direct contact interconnect build-up structures or multi-layer structures without capture pads.

BACKGROUND

Semiconductor devices, packages, substrates, and interposers are commonly found in modern electronic products. Production of semiconductor devices involves a multistep build-up of components. Conventional interconnect structures alternate dielectric and conductive layers. An opening or via is created in the dielectric to allow connectivity from one layer to another. On the conductive layers, capture pads are required for the vias to correct for inconsistencies in manufacture. Use of these conventional capture pads impacts the ability to construct compact structures due to limits on routing density. Additionally, some traditional manufacturing processes involve the use of leadframes that result in exposed leadframe ends on the sides of the packaging.

FIG. 1A, illustrates an image of a conventional QFN package 500 with side lengths of 5 mm. Those of ordinary skill in the art are familiar with QFN, DFN and SON package structures. No-lead packages such as QFN, DFN and SON packages physically and electrically connect to the surface of printed circuit boards (PCBs) or other substrates using surface mount technology, thus coupling the IC to the PCB or other substrate. In the surface mount technology illustrated in the conventional QFN package 500 of FIG. 1A, the LGA pads 502 are exposed on the lower surface 504 of the package 500 (shown facing up in the figure) and on the side edges 506 of the package 506. As used herein, the lower surface 504 is the surface that is subsequently oriented towards and coupled with a PCB or other substrate.

In particular, a portion of the leadframe, called the tie bar 508, is cut and exposed along the side edges 506 during singulation of the packages. Additionally, when the packages 500 are cut during singulation, because the land pads extend to the edge 506 of the package 500, the saw creates a burr 510 that extends from the LGA pads 502 caused by the saw heat and rotation as it cuts along the edge of the LGA pads 502. This burring that extends in each of the X-, Y- and Z-planes is a known problem of QFN singulation and requires costly process measures to reduce them or additional processing to remove them.

FIG. 1B, illustrates an example of a leaded package 530 covered with encapsulant 536, further showing a cut-way perspective view of a wirebonded chip. Leaded packages are near chip-scale plastic encapsulated package made with a metal leadframe substrate. FIG. 1B illustrates a partial cut-away view of a chip package 530 with a chip wirebonded to metal leads 534 of a conventional leadframe package 530 where the leads 534 extend through the molded plastic encapsulant 536 and to an edge of the body of the plastic package to facilitate mounting or soldering the chip package 530 to a PCB. A leadframe to which ICs or semiconductor chips may be mounted is also shown. A leadframe is the metal structure inside a leadframe-based chip package that creates leads which carry signals and power to and from the chip to the outside through metal conductors leading away from the chip.

As seen in FIG. 1A, QFN, DFN, and SON packages comprise perimeter LGA pads 502 on the package edge 506 to provide electrical connections to the PCB, rather than using leads that extend beyond the body of the package. During packaging prior to singulation, the QFN, DFN and SON packages are in strip form, connected to adjacent packages on the leadframe. This also means that they are electrically interconnected through the conductive leadframe. The packages are later isolated or separated by cutting between the packages. In conventional QFN, DEN and SON packages, partial sawing to isolate each unit electrically is required before testing to allow electrical testing of the individual packaged semiconductor chips.

QFN, DFN and SON packages (as shown in FIG. 1A) may include LGA pads or other land pads within a footprint of the encapsulant rather than the leads that extend beyond the footprint or body of the encapsulant. QFN, DFN and SON packages may also include an exposed thermally conductive pad, die pad or flag 512, as shown above in FIG. 1A, to improve heat transfer out of the IC (into the PCB or substrate it is attached to). A flag 512 provides a heat dissipation point for the package for structures thermally coupled to it.

FIG. 1C illustrates a package 540 comprising an encapsulant 536 disposed around a component, such as a chip, the package or assembly 540 further comprising raised interconnects or pads 544, such as for electrical interconnect, and a conductive material 512 centrally located at a surface of the package 540 (such as a flag 512) for heat transfer.

FIG. 1D, illustrates a package 550 comprising a LGA 552, which is a type of surface-mount packaging that can be used for integrated circuits (ICs) and for coupling assemblies together, through (and to) printed circuit boards (PCBs), substrates, and other structures. The LGA 552 may comprise pads 554 that may be arranged around a perimeter of the package 550, such as being arranged in multiple rows, and may further comprise pads 554 in a center or central area of the package 550. The LGA 552 illustrated in FIG. 1D is another example of the prior art that may benefit from the features disclosed in the present disclosure, which can relate to (and improve) other packages, assemblies, and substrates more generally.

SUMMARY

In some aspects, the disclosure concerns a method of making an assembly or package comprising an encapsulant-defined land grid array (LGA) (or LGA pads) that includes disposing a semiconductor chip face-up on a temporary carrier. The semiconductor chip may comprise conductive studs disposed over an active layer of the semiconductor chip. A first encapsulant may be disposed in a single step around at least four side surfaces of the semiconductor chip, over the active layer of the semiconductor chip, and around at least a portion of sidewalls of the conductive studs. A surface of the first encapsulant and conductive studs may be planarized. Conductive traces may be formed over the encapsulant and coupled with the conductive studs. A dielectric layer may be disposed adjacent the conductive traces. Land grid array (LGA) pads may be formed and coupled with the conductive traces. A second encapsulant may be disposed over the dielectric layer and the LGA pads. A surface of the second encapsulant and the LGA pads may be planarized to form an upper encapsulant surface and attachment areas. The plurality of attachment areas may be coplanar or recessed within 2 micrometers of the upper encapsulant surface to form the encapsulant-defined LGA from the plurality of attachment areas.

In some instances, the dielectric comprises one or more of an organic material, an inorganic material, and a polymer such as polyimide. The offset of 2 micrometers or less between the plurality of attachment areas and the upper encapsulant surface may result from an etching process. A solderable metal system (SMS) or an organic solderability preservative (OSP) may be formed over the plurality of attachment areas either before or after planarizing the surface of the second encapsulant. The conductive layer may comprise one or more of traces and a flag. The flag may comprise an irregular perimeter with indentations and fingers to increase a surface are of the flag that extends outside a footprint of the component. The conductive layer may comprise corner pads formed as flag extensions. The first encapsulant and the second encapsulant may comprise a same material. At least one of a through mold post and a double-sided circuit trace may be formed as part of the assembly or package. A component may be mounted over the encapsulant defined LGA to form a 3D assembly, wherein the mounted component crosses a shadow of the semiconductor chip. The conductive layer or the LGA pads may be formed using adaptive patterning or laser direct imaging (LDI).

In other aspects, the disclosure concerns a method of making an assembly or package comprising an encapsulant-defined LGA (or LGA pads), comprising forming a plurality of LGA pads, forming encapsulant over and around the plurality of LGA pads, and removing a portion of the encapsulant from over the plurality of LGA pads to form a plurality of attachment areas and an upper encapsulant surface. The plurality of attachment areas may be substantially coplanar or recessed within 2 micrometers of the upper encapsulant surface to form the encapsulant-defined LGA pads.

In some instances, a SMS or an OSP may be formed over the plurality of attachment areas either before or after removing a portion of the encapsulant from over the plurality of LGA pads to form a plurality of attachment areas. A component comprising conductive studs may be provided and conductive traces disposed over the encapsulant and coupled with the LGA pads and the conductive studs of the component. A dielectric layer may be formed adjacent the conductive traces, wherein the dielectric comprises one or more organic material, an inorganic material, and a polymer such as polyimide. The conductive layer or the LGA pads may be formed using adaptive patterning or LDI. The offset of 2 micrometers or less between the plurality of attachment areas and the upper encapsulant surface may results from an etching process.

In other aspects, an assembly or package comprising an encapsulant-defined LGA (or LGA pads), may comprise a component comprising conductive studs over a surface of the component, and a single first encapsulant disposed around at least four sides surfaces of the component, over the component, and around at least a portion of sidewalls of the conductive studs. A first planar surface comprising a surface of the first encapsulant and an exposed surface of each of the conductive studs may be present. A conductive layer may be disposed over the first encapsulant and coupled with the conductive studs. LGA pads may be coupled with the conductive layer. A second encapsulant layer may be disposed over the conductive layer and around the LGA pads. A second planar surface comprising a surface of the second encapsulant layer and adjacent at least a portion of the LGA pads may be exposed with respect to the second encapsulant to form a plurality of attachment areas. The plurality of attachment areas may be coplanar or recessed within 2 micrometers of the second planar surface to form the encapsulant-defined LGA.

In some instances, a SMS or OSP may be formed over the plurality of attachment areas. A component comprising conductive studs may be present and conductive traces may be disposed over the encapsulant and coupled with the LGA pads and the conductive studs of the component. A dielectric layer may be formed adjacent the conductive traces, wherein the dielectric comprises one or more of an organic material, an inorganic material, and a polymer such as polyimide. An alignment between the conductive layer and the conductive studs of the component may be greater than an alignment between the component and a package edge.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that they can be their own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . ." or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

BRIEF DESCRIPTION OF THE DRAWINGS

FIGS. 1A-1D illustrate various assemblies, such as semiconductor packages, QFNs, and LGAs, as known in the prior art.

DETAILED DESCRIPTION

Figure 2A:
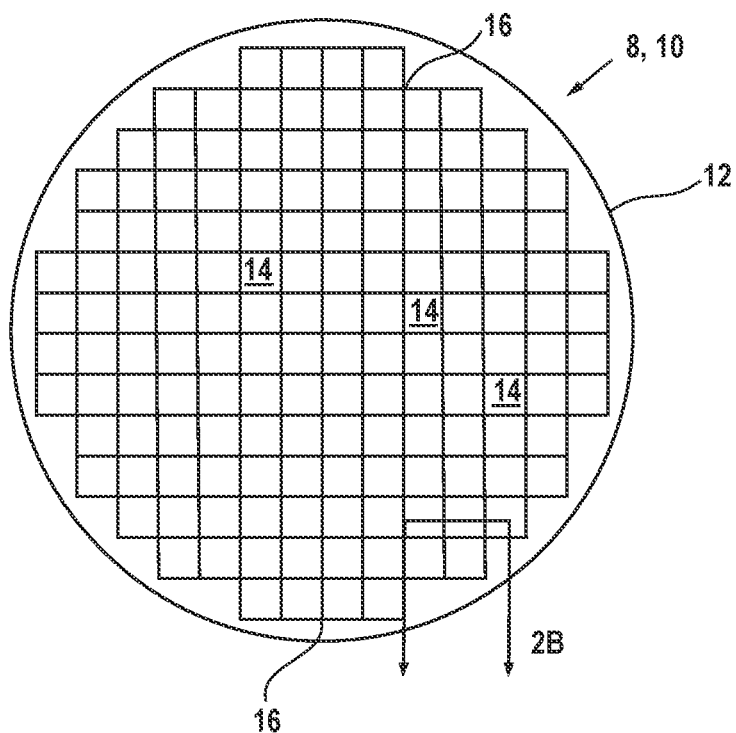
FIGS. 2A-2D illustrate components, such as semiconductor die, chips, and embedded devices.

The present disclosure includes one or more aspects or embodiments which are described and illustrated in the following written description with reference to the figures, in which like numerals represent the same or similar elements. More specifically, this disclosure relates to semiconductor assemblies comprising encapsulant defined LGAs.

A person of ordinary skill in the art (POSA) will appreciate that the description is intended to cover alternatives, modifications, and equivalents as may be included within the spirit and scope of the disclosure as defined by the appended claims and their equivalents as supported by the following disclosure and drawings. In the description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGS. are illustrative representations and are not necessarily drawn to scale.

This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise one or more of any components, models, types, materials, versions, quantities, and the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity. As used herein, "substantially" or "about" means the stated amount plus or minus (+ or −) 50% or less, 40% or less, 30% or less, 20% or less, 10% or less, 5% or less, or 1% or less.

Where the following examples, embodiments and implementations reference examples, it should be understood by those of ordinary skill in the art that other manufacturing devices and examples could be intermixed or substituted with those provided. In places where the description refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

This disclosure relates to a quad flat no-lead (QFN), dual flat no-lead (DFN) or small-outline no-lead (SON) package without a leadframe and with molded direct contact interconnect build-up structures, and a method of making the same. This disclosure further relates to IC packages with encapsulant-defined LGA and methods for making the same. A QFN, DFN or SON is a small-sized integrated circuit (IC) package that offers small size, low cost, and very good performance.

The present disclosure relates to QFN, DFN and SON packages without a leadframe, and with molded direct contact interconnect build-up structures. An example of a molded direct contact interconnect build-up structure is known under the trademark or tradename MDx™. The present disclosure also relates to other semiconductor packages, assemblies, and substrates more generally.

At least some of the above advantages are available at least in part by using unit specific patterning (such as adaptive patterning, custom design, and lithography) and build-up interconnect structures such as a frontside build-up interconnect structure, which is also known under the trademark "Adaptive Patterning," referred to as "AP." Unit specific patterning allows for the use high-speed chip attach for semiconductor chips and AP will ensure alignment for high density interconnects with the molded direct contact interconnect build-up structures. Adaptive Patterning may also be used in the herein disclosed processes for manufacturing QFN, DFN and SON packages including the ability to make large area connections which are precisely aligned to chip bond pads for very low contact resistance.

FIG. 2A illustrates a plan or top view of a substrate 8, which may comprise a semiconductor wafer or native wafer 10 with a base substrate material 12, such as, without limitation, silicon, germanium, gallium arsenide, indium phosphide, or silicon carbide, for structural support. A plurality of chips, semiconductor die, or components 14 can be formed on wafer 10 separated by a non-active, inter-die wafer area or saw street 16. As used herein, the component 14 comprises active devices, passive devices, or both. Components 14 comprise semiconductor components, chips, and semiconductor die. Components 14 further comprise non-semiconductor components such as components that are non-active or are formed without transistors. Components 14 comprise sensors and Microelectromechanical systems (MEMS) that do not rely on a semiconductor materials for making transistors. Components 14 also comprise discrete passives such as resistors or capacitors, other semiconductor die, ICs, bridge die, wafer level chip scale packages (WLCSPs), MEMs, optical components including image sensors and light emitting diodes (LEDs), and any other suitable component. For purposes of illustration, a non-limiting example of the component 14 being a chip or semiconductor die is described in FIGS. 2A-2D. Accordingly, the saw street 16 can provide cutting areas to singulate the semiconductor wafer 10 into the individual components or chips 14 that become embedded devices can be formed on a substrate 8 formed of glass, ceramic, or other suitable material for providing structural support for subsequent processing.

Each component 14 may comprise one or more active devices, passive devices, or both active devices and passive devices. In some instances, the component 14 may be formed without active and passive devices, and be used for transmission or routing, such as by comprising TSVs for vertical interconnect. For example, the component 14 may be formed as a bridge chip with only electrical routing and with copper studs of the semiconductor chip electrically connected or coupled with wiring, routing, or RDL. The component 14 may also be only a dummy substrate with no electrical function, but rather act as structural element and may or may not include copper studs.

The component 14 may comprise semiconductor chips and semiconductor die that comprise a backside or back surface 18 and an active layer 20 opposite the backside 18. The active layer contains one or more analog, or digital circuits implemented as active devices, conductive layers, and dielectric layers formed within or on the chip and electrically interconnected according to the electrical design and function of the semiconductor chip. In some instances, passive devices may also be integrated as part of the semiconductor chip or semiconductor die. The component 14 may comprise circuits that may include one or more transistors, diodes, and other circuit elements formed within the active layer to implement analog circuits or digital circuits, such as DSP, ASIC, memory, or other signal processing circuits. Digital circuits may include RF circuits, LED, LCOS, CIS, transistor, optoelectronic, MEMS and the like. The component 14 may also contain IPDs such as inductors, capacitors, and resistors, for RF signal processing, digital power line control or other functions. The component 14 may be formed on a native wafer 10. In some instances, a wafer level process may be used to produce many packages simultaneously on the wafer 10. In other instances, the package may be formed as part of a reconstituted wafer and may comprise multiple components or chips molded together.

Figure 2B:
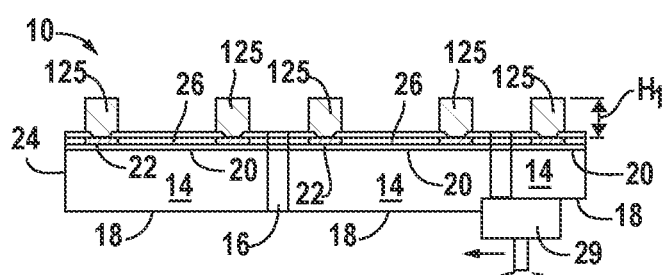

FIG. 2B illustrates a cross-sectional view of a portion of semiconductor wafer 10 shown taken along the section line 2B in FIG. 2A. Each component 14 is shown comprising a backside or back surface 18 and an active layer 20 opposite the backside.

An electrically conductive layer or contact pads 22 is formed over active layer 20 using PVD, CVD, electrolytic plating, electroless plating process, or other suitable metal deposition process. Conductive layer 22 can be one or more layers of aluminum (Al), Titanium (Ti), copper (Cu), tin (Sn), nickel (Ni), gold (Au), palladium (Pd), silver (Ag), cobalt (Co), platinum (Pt), or other suitable electrically conductive material. Conductive layer 22 operates as contact pads or bond pads electrically coupled or connected to the circuits on active layer 20. Conductive layer 22 can be formed as contact pads disposed side-by-side a first distance from an edge 24 of component 14, as shown in FIG. 1B. Alternatively, conductive layer 22 can be formed as contact pads that are offset in multiple rows such that a first row of contact pads is disposed a first distance from the edge 24 of the component 14, and a second row of contact pads alternating with the first row is disposed a second distance from the edge 24 of the component 14. In other instances, the component 14 can comprise digital chips, analog chips, or RF chips (or other chips) with more than two rows of bond pads and may further comprise bond pads 22 over the whole surface of the chip that do not follow a full grid pattern. Other components 14 may have bond pads in an array over the whole surface of the chip.

FIG. 2B also illustrates the semiconductor substrate 10 and components 14 can undergo an optional grinding operation, such as with grinder 29, wet etching, plasma etching, or other suitable process, to reduce a thickness of the semiconductor substrate 10 and component 14.

FIG. 2B further shows one or more optional insulating, passivating, or dielectric layer 26 may be conformally applied over active layer 20 and over conductive layer 22. Insulating layer 26 can include one or more layers that are applied using PVD, CVD, screen printing, spin coating, spray coating, sintering, thermal oxidation, or other suitable process. Insulating layer 26 can contain, without limitation, one or more layers of silicon dioxide ($SiO_2$), silicon nitride ($Si_3N_4$), silicon oxynitride (SiON), Carbon-Doped silicon Oxide (CDO), tantalum pentoxide ($Ta_2O_5$), aluminum oxide ($Al_2O_3$), polymer, polyimide, Carbon-Doped Oxide (CDO), benzocyclobutene (BCB), polybenzoxazoles (PBO), or other material having suitable insulating and structural properties. Alternatively, components 14 are packaged without the use of insulating layer 26. In another embodiment, insulating layer 26 includes a passivation layer formed over active layer 20 without being disposed over conductive layer 22. When insulating layer 26 is present and formed over conductive layer 22, openings are formed completely through insulating layer 26 to expose at least a portion of conductive layer 22 for subsequent mechanical and electrical interconnection. Alternatively, when insulating layer 26 is omitted, conductive layer 22 is exposed for subsequent electrical interconnection without the formation of openings.

FIG. 2B shows conductive studs or electrical interconnect structures 125 can be formed as bumps, thick pads, columns, pillars, posts, or conductive studs and are disposed over, and coupled or connected to, contact pads 22. The conductive studs 125 can be formed directly on contact pads 22 using patterning and metal deposition processes such as printing, PVD, CVD, sputtering, electrolytic plating, electroless plating, evaporation, or other suitable metal deposition process. Alternately, conductive studs 125 may be formed in a position not vertically over the pads 22 and connected by RDL. Conductive studs 125 can be one or more layers of Al, Cu, Sn, Ni, Au, Ag, palladium (Pd), or other suitable electrically conductive material and can include one or more Under-Bump Metallization (UBM) layers. In an embodiment, a photoresist layer can be deposited over component 14 and contact pads 22. A portion of the photoresist layer can be exposed and removed by a developing or other suitable process. Electrically conductive studs 125 can then be formed as pillars or other structures as previously described in the removed portion of the photoresist and over contact pads 22 using a plating process. In some embodiments, copper may be used in a plating process. The photoresist layer and other appropriate layers, such as the seed layer, can be removed leaving conductive studs 125 that provide for subsequent mechanical and electrical interconnection and a standoff with respect to active layer 20 and insulating layer 26 if present. In some instances, the conductive studs 125 include a height $H_1$ in a range of 10-100 micrometers (µm), 5-50 µm, or about 25 µm.

A conductive stud is a conductive interconnect structure that may have generally vertical sides and may be wider than it is tall, built-up on a substrate, such as over an active surface of a chip, polyimide, or mold compound. A conductive stud, though typically formed of the same materials as a pillar or post would be formed, may differ from a pillar or post, each of which may have a height greater than its width. A conductive stud, though it is commonly formed in a cylindrical shape, may be formed with a cross-sectional area that is circular, oval, octagonal, or as any polygonal or other shape and size. Another use for a conductive stud is as a dummy thermal conductive stud that is not electrically coupled to an active electrical circuit but is instead thermally coupled to a heat source of an active device to conduct or dissipate the heat to another structure, such as to a land pad on a surface of a PCB. The generally vertical sides of a conductive stud 125 are different from the sides shape that exists for a solder ball or a compressed or outwardly deformed solder ball that has generally rounded sides. The generally vertical nature of a conductive stud 125 comes from being formed in a structure that has been previously developed or etched, such as within openings in a photoresist layer, which will also be generally vertical, although it may comprise imperfections or irregularities in shape that result from the etching process, the photoresist material, or other materials and processes used. For example, developing or etching does not generally perfectly or uniformly remove the photoresist within the openings, and therefore forms imperfect, generally vertical openings for deposition of conductive materials for the conductive stud 125. The term "generally vertical" as used herein includes perfectly vertical and imperfectly vertical sides. A conductive stud is not a wire bond and is not solder.

Figure 2C:
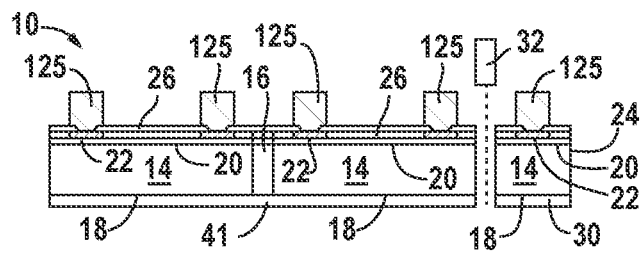

FIG. 2C further illustrates an instance in which one or more of an optional adhesive or a die attach film (DAF) 41—which in some instance may even be a conductive material for thermal transfer or other suitable purpose—may be attached to the back surface 18 of the component 14, such as for subsequent mounting on a carrier. FIG. 2C also illustrates wafer 10 can be singulated with a saw or wafer cutting tool 32 into individual components 14 through saw streets 16 using a saw blade, laser cutting tool, plasma, or a scribe and break process. In some instances, the components 14 will have a thickness (shown in the vertical direction, bottom to top, of the page) of between about 15 µm to about 150 µm for thin ground wafers, or about 100 µm to about 800 µm for thick ground wafers.

Figure 2D:
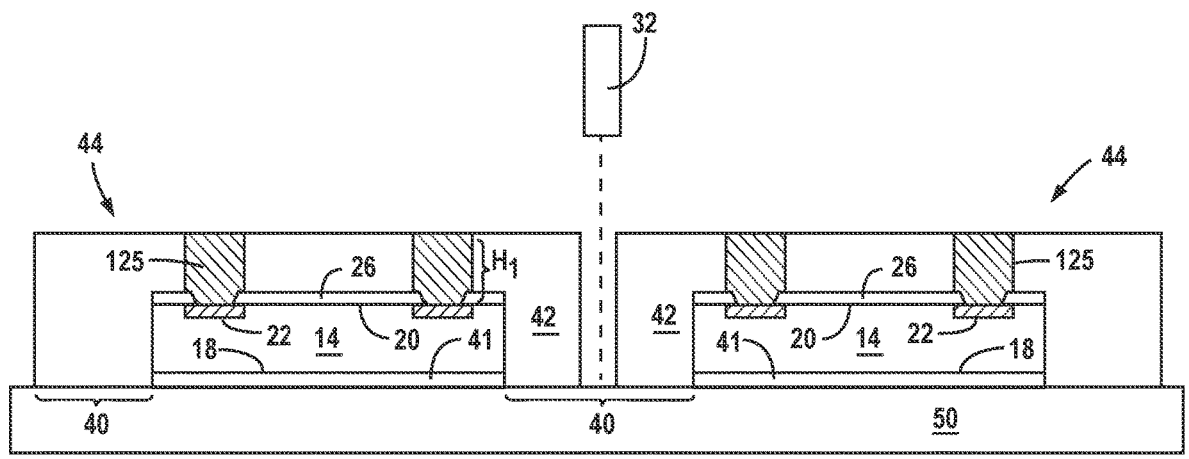

FIG. 2D, illustrates a cross-sectional view of an instance in which the components 14 are formed as embedded components or embedded semiconductor devices 44. The embedded components 44 can be disposed over a temporary carrier, a reusable carrier, a sacrificial carrier, or any suitable carrier 50, made of metal, glass, silicon, mold compound, or other suitable material, which may include a release layer. The carrier 50 may comprise a form factor or footprint of a wafer (circular footprint), a panel (square or rectangle), or of any suitable shape and may comprise a diameter or width of 200-600 mm, such as 300 mm, or of any other suitable size. The embedded components 44 can be separated by being singulated through gaps or saw streets 40 using a saw blade, grinding wheel, plasma cutting tool, laser cutting or other suitable tool 32 into individual embedded components or embedded semiconductor devices 44 which may be interchangeably used with components 14 in any of the subsequent FIGS. and explanations. The embedded components 44 can then be used as part of a subsequently formed assembly or package as discussed in greater detail below. However, the embedded component 44 comprising a chip or semiconductor die or other component 14 can also be fully testable after conductive studs 125 are applied and before the embedded components 44 are singulated from a panel, or assembled into another structure.

In some instances, the embedded semiconductor die 44 can be formed as described in U.S. patent application Ser. No. 13/632,062, now U.S. Pat. No. 8,535,978, entitled "Die Up Fully Molded Fan-out Wafer Level Packaging," which was filed on Apr. 29, 2015, the entirety of the disclosure of which is incorporated herein by this reference.

Figure 3A:
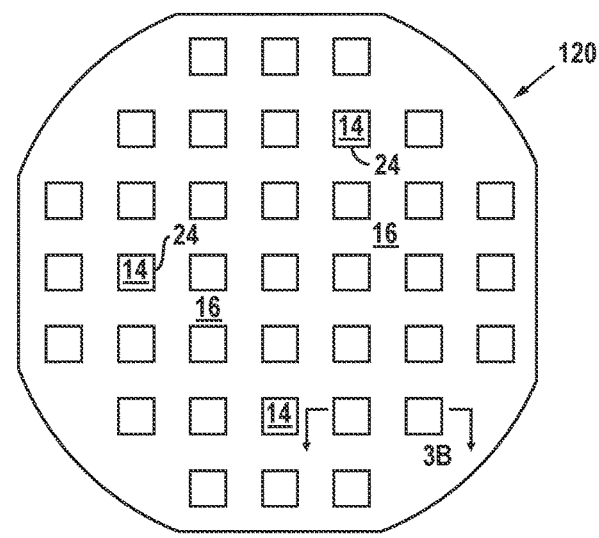
FIGS. 3A-3F illustrate the formation of a reconstituted wafer or panel, comprising components disposed within an encapsulant.

FIG. 3A illustrates a plan or top view of the temporary carrier 120, which may comprise a form factor or footprint of a wafer (circular or substantially circular footprint), a panel (square or rectangle), or of any suitable shape (such as generally circular with flat edges), and may comprise a diameter or width of 200-600 mm, such as 300 mm, or of any other suitable size. Components 14 may be disposed over temporary carrier 120 using a pick and place operation, or in any other suitable way.

The orientation of components 14, can be either face up with active layer 20 oriented away from carrier 120 to which the components 14 are mounted, or alternatively can be mounted face down with active layer 20 oriented toward the carrier 120 to which the components 14 are mounted. Accordingly, an adhesive 41 can be included or omitted from over back surface 18 of components 14, depending on the process used for encapsulating the components 14 and forming a panel or reconstituted panel 134 comprising components 14 fully molded within encapsulant 130.

Figure 3B:
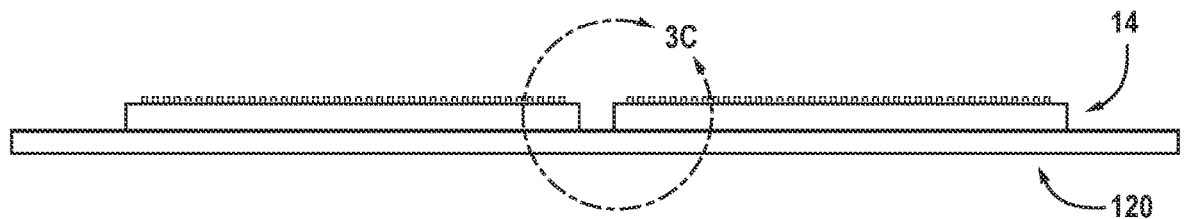

FIG. 3B, illustrates a cross-sectional profile view of components 14 or 44 disposed face-up over a temporary carrier 120, the components 14 each comprising conductive studs 125 disposed over a front side of the components, which when present, can be the active layer 18. In some instances, the temporary carrier 120 may be a metal carrier, a silicon carrier, a glass carrier, or a carrier made of other suitable material used for the molding or encapsulating process, and then be removed after the encapsulant, such as mold compound, filled epoxy film such as ABF, or other dielectric such as polyimide has been placed, cured, or both, such that the encapsulant provides structural support and the temporary carrier is no longer needed for processing. The components 14 may be placed adjacent or laterally offset one another, such as in a side-by-side arrangement, so that multiple components 14 may be disposed within the reconstituted wafer 134 at a panel level (as shown, e.g., in FIG. 3E) and processed through various fabrication steps, before being singulated into individual assemblies or packages, including QFN, DFN or SON packages 300. As such, multiple components 14 may also be processed together at a same time over the temporary carrier 120, which will be understood by a POSA, even when a close-up view of just portions of the components 14 are shown.

Figure 3C:
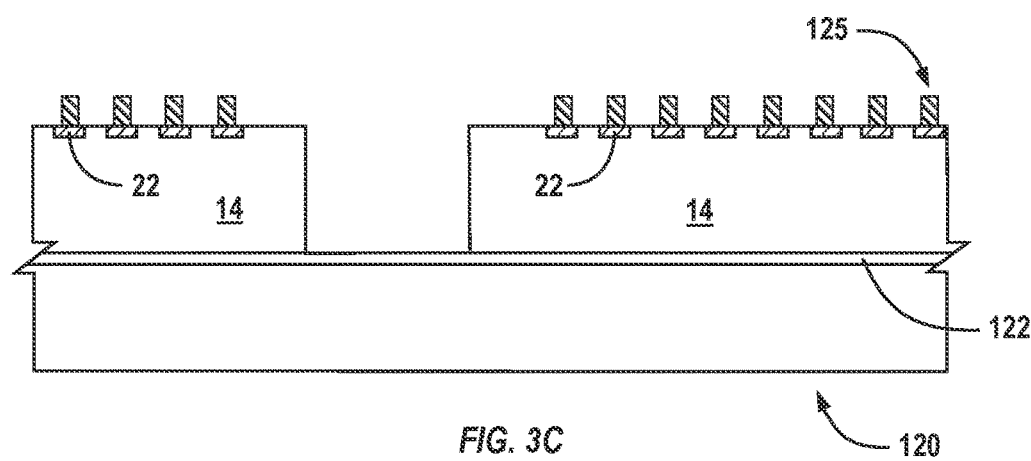

FIG. 3C, illustrates a close-up view of components 14 taken along section marker of FIG. 3B, emphasizing the conductive studs 125 formed over a surface or active layer 20, and aligned on components 14. Although it is not required for every embodiment, the conductive studs 125 of the particular embodiments illustrated herein are shown about a perimeter of the components 14 for the particular implementation in which they will be used. An optional interface layer 122, such as double-sided tape, film or deposited material, may be used beneath the components 14 to temporarily hold them to the temporary carrier 120 during processing.

Figure 3D:
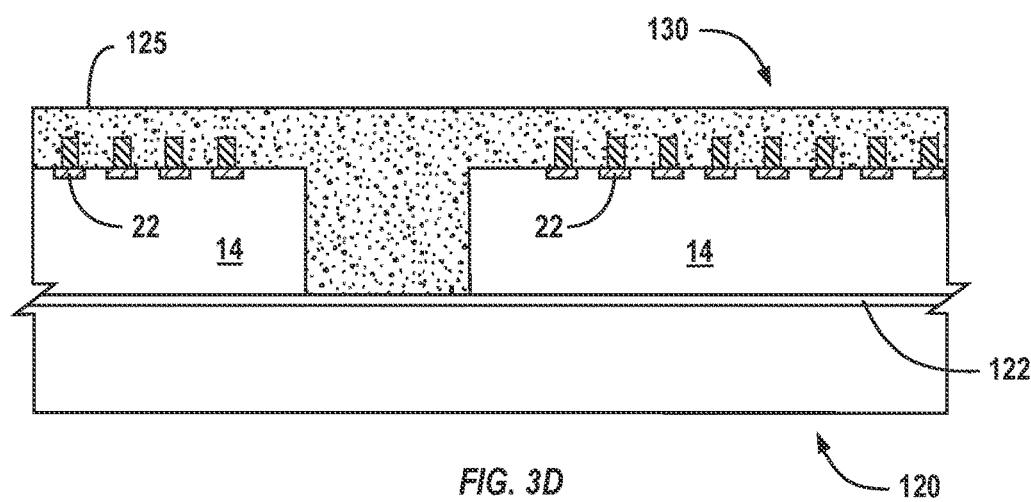

FIG. 3D, continuing from FIGS. 3B and 3C, illustrates disposing an encapsulant 130 around the components 14 face-up over a temporary carrier 120 around four side surfaces of the component 14, over the frontside of the components 14, and around the conductive studs 125. As used herein, over, on or around may mean in direct contact with, or with other intervening layers, such as polymer or polyimide layers disposed between the chips 14 and the encapsulant 130. The conductive studs 125 formed over the active layer of the components 14 may be in contact with, surrounded by, partially encircled by, or encapsulated or molded with a single encapsulant, polyimide or mold compound at a single step such that the same encapsulant, polyimide or mold compound 130 is disposed around the components 14, including at least 4 side surfaces. The encapsulant 130 can be deposited around the plurality of components 14 using a paste printing, compression molding, transfer molding, liquid encapsulation, dispensing, lamination, vacuum lamination, spin coating, slit or slot die coating, or other suitable application. The encapsulant 130 comprises an organic material, a mold compound, a polyimide, a composite material, such as epoxy resin with filler, such as ABF or epoxy acrylate with filler, and is a material suitable for planarizing, such as through chemical mechanical planarizing (CMP) or grinding. As such, in some instances the encapsulant 130 will not be a polymer material, such as an un-filled polyimide, that may not perform well in a grinding operation, and may gum-up a grinding wheel. FIG. 3F illustrates the exposed planar surface 132 with the conductive studs 125 exposed.

Figure 3E:
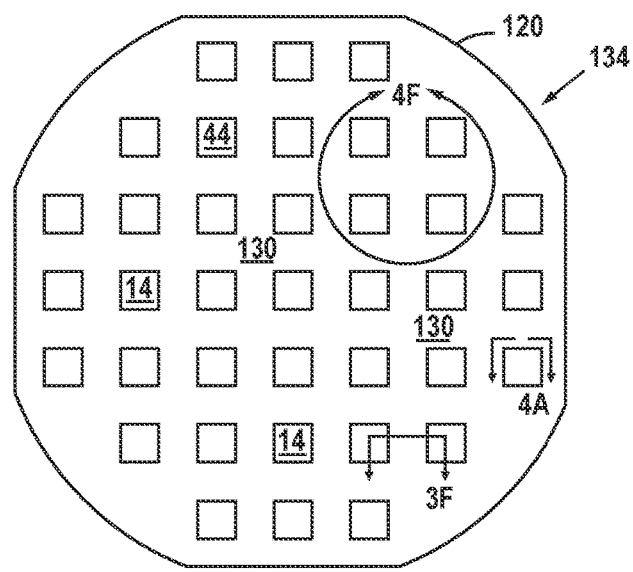
Figure 3F:
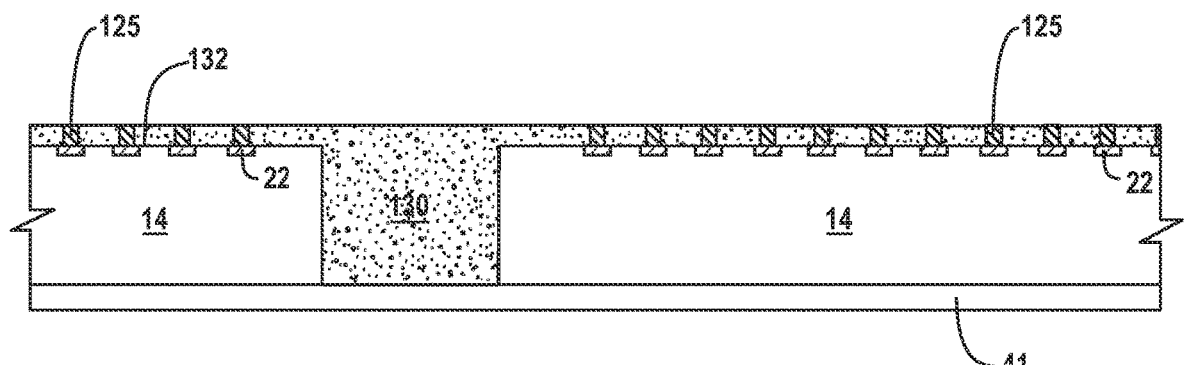

FIG. 3E, continuing from FIG. 3D, is a plan view of the entire reconstituted wafer or panel 134, of which FIG. 3D is a cross-sectional side view of a portion of the reconstituted wafer 134, taken along the section line 3D. FIG. 3E presents a plan view of the components 14 within panel 134 taken along the section line 3F, and similar to the plan view of the components 14 over the carrier 120 shown in FIG. 3A. FIG. 3E differs from FIG. 3A by the inclusion of encapsulant 130 disposed over, around, or both over and around the components 14.

FIG. 3E illustrates the encapsulant 130 can be deposited around the plurality of components 14 using a paste printing, compression molding, transfer molding, liquid encapsulant molding, lamination, vacuum lamination, spin coating, or other suitable application method. The encapsulant 130 can be a polymer composite material, such as epoxy resin with filler commonly referred to as molding compound or EMC, epoxy acrylate with filler, ABF (Ajinomoto Build-up Film®), or other polymer with proper filler. Components 14 can be embedded together in encapsulant 130, to form a panel, reconstituted panel, wafer, or reconstituted wafer 134, that allows for the processing and packaging of multiple components 14 at a same time to form a plurality of assemblies, packages, including QFN, DFN or SON packages 300. The panel 134 can be non-conductive and provide mechanical rigidity as well as environmentally protect the components 14 from external elements and contaminants.

The panel 134 can optionally undergo a curing process to cure encapsulant 130. A surface of encapsulant 130 can be substantially coplanar with adhesive 41, as illustrated in FIG. 3F. Alternatively, encapsulant 130 can be substantially coplanar with backside 18, the encapsulant being exposed by the removal of carrier and interface layer. The reconstituted panel 134 can include a footprint or form factor of any shape and size including circular, rectangular, or square, such as a form factor in a range of 200-600 millimeters (mm), including that of a semiconductor wafer including a circular footprint having a diameter of 300 mm. Any other desirable size can also be formed.

FIG. 3F, continuing from FIG. 3D and FIG. 3E, also illustrates that after molding or placement of encapsulant 130, the temporary carrier 120 may be removed, and a backside or back surface of the components 14 may be exposed from the encapsulant 130. Alternatively, a backside laminate, encapsulant, die attach film (DAF) or other material 41 may be disposed over the backside of the components 14 as shown in FIG. 2C. Thus, in some instances the backside laminate (including polyimide or mold compound) may be more than temporary and may become part of the final product, or may be removed at a later process step, such as at a grinding or polishing step. In reference to FIGS. 6A-6J, different processing steps may be included to result in the backside of the semiconductor chip being exposed with respect to, or covered by, encapsulant or other material.

Planarizing or grinding the encapsulant 130 over the frontside or active layer 20 to expose the conductive studs 125 may occur before or after removing the temporary carrier 120. As referenced above, FIG. 3F illustrates a close-up view of a portion of the components 14 after planarizing the encapsulant 130 over the frontside or active layer 20 of the components 14 to create a planar surface 132 comprising exposed ends of the conductive studs 125 and further comprising a planarized encapsulant surface. The planarizing or grinding of the encapsulant produces a flatness of within a range of about 0.5-2.0 micrometers (µm) and a total roughness height from peak to valley measured over a 1 millimeter (mm) length of between 5 nanometers (nm) and 2 µm. While conventional encapsulant grinding might be done with less flatness, greater accuracy and precision can be obtained by using integrated sensors such as laser, acoustic, or other non-contact methods to control the grinding resulting in better flatness. In some instances, the first conductive studs 125 may be formed with a height of less than or equal to about 50 micrometers (μm) or less than or equal to about 250 μm, and then be ground down to a height of less than its original height, such as, in a particular embodiment, less than or equal to about 4 μm or 1 μm. As used herein, "about" or "substantially" means a percent difference less than or equal to 50% difference, 40% difference, 30% difference, 20% difference, 10% difference, or 5% difference.

Figure 4A:
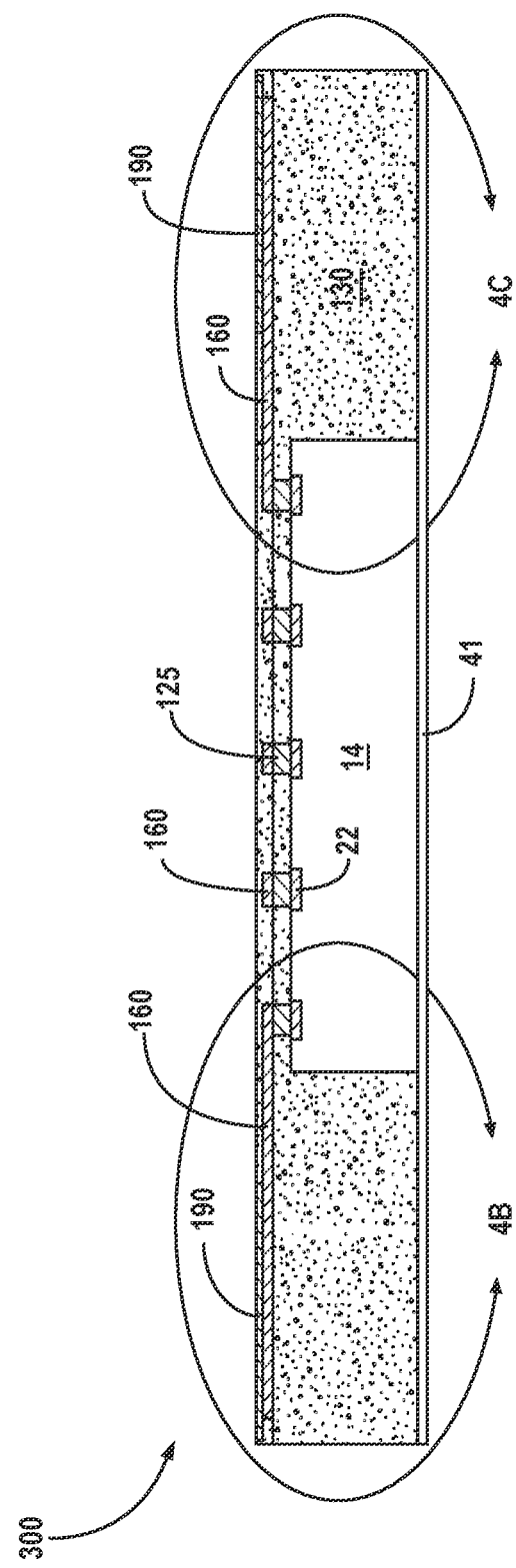
FIGS. 4A-4G illustrate various instances of encapsulant defined LGAs being formed over encapsulant.

FIG. 4A, continuing from FIG. 3F, is a cross-sectional side view showing a fan out interconnect structure 140 comprising encapsulant defined LGA pads, LGA pads, or vertical conductive elements 190. The fan out interconnect structure 140 comprises one or more of a conductive layer 160, wherein the conductive layer 160 may comprise one or more of redistribution layer (RDL) 162, one or more traces 164, and bussing lines 166, which may be disposed over the first encapsulant 130 and coupled with the conductive studs 125. The conductive layer or conductive element 160 may be formed over the encapsulant 130, the component 14, or both as shown in FIG. 4A. In some instances, the conductive layer 160 may comprise conductive routing, traces 164, as well conductive stumps, or vias, of different thicknesses. The conductive layer 160 may comprise one or more features, including traces, land pads, capacitators, inductors, shielding, resistors, antenna or antenna feed, or other feature or structures. A top or plan view comprising the conductive layer 160 is shown in FIG. 4E. FIG. 4E illustrates a portion of the reconstituted wafer 134 that is indicated by the detail line 4F in FIG. 3E.

The conductive layer 160 can be one or more layers of Al, Cu, Sn, Ni, Au, Ag, Ti, Cu, W, or a coupling agent, copper, or other suitable electrically conductive material. The conductive layer 160 can be formed using PVD, CVD, electrolytic plating, electroless plating, or other suitable process. In an embodiment, the conductive layer 160 can comprise a Ti diffusion barrier layer or barrier layer, a Cu seed layer, and a Cu layer formed over the Ti barrier layer and the Cu seed layer. Typically, the barrier and seed layers are deposited by a PVD process, such as sputtering. In addition to providing good adhesion to the underlying material it is deposited on, the barrier and seed layers provide a plating bus that can enable electrolytic plating of a conductor (such as a plated conductive element) over the seed layer.

A support material 148 comprising one or more layers of dielectric, insulating, or passivation layers 150, 170, and also comprising one or more layers of encapsulant 130, 180, may be formed at least partially around, contact, reinforce, or support the conductive layer 160. Dielectric layers 150, 170, may comprise one or more layers of insulating, passivating, or dielectric material that are applied using PVD, CVD, screen printing, spin coating, spray coating, sintering, thermal oxidation, or other suitable process. Dielectric layers 150, 170 can contain, without limitation, one or more of an organic material, an inorganic material, and a polymer including one or more layers of $SiO_2$, $Si_3N_4$, SiON, CDO, $Ta_2O_5$, $Al_2O_3$, polyimide, BCB, PBO, or other material having suitable insulating and structural properties. The support material 148 may be formed around the conductive layer 160, including being formed as one or more layers below, above, and completely or partially surrounding the conductive material 160 or multiple layers of conductive material 160. As noted above, the support material 148 may comprise one or more layers of mold compound 130, 180 or one or more layers of organic materials, polymer material or any suitable dielectric, including inorganic dielectrics, such as dielectric layers 150, 170. In some instances, the non-mold compound layers 150, 170 may comprise one or more polymer layers disposed on the sides, over, under, or both over and under the conductive layer 160, including conductive elements, or conductive features, and RDLs 162, wherein the dielectric layers 150, 170 comprise improved dielectric properties for better electrical performance than the encapsulant or mold compound 130, 180, especially for high performance parts. The dielectric layers 150, 170, e.g. when made of polymer or polyimide, can provide higher resistance to leakage currents or higher breakdown voltage than mold compound for high voltage applications, as well as superior electrical performance for high frequency signals.

The support material 148 can include one or more of the features or approaches presented in U.S. Pat. Application 63/347,516 titled "Molded Direct Contact Interconnect Build-up Structure Without Capture Pads," filed May 31, 2022, as well as the features and approaches presented in U.S. Pat. Application 63/391,694 titled "Molded Direct Contact Interconnect Substrate," filed Jul. 22, 2022 may also be used. U.S. Pat. Application 63/347,516 and U.S. Pat. Application 63/391,694 (in their entireties) are hereby incorporated by reference herein.

Vias or openings 174 in the support material 148 can be formed to facilitate subsequent electrical interconnection with one or more conductive layers, or to provide structural support or a thermally conductive path. FIGS. 4C and 4D illustrate instances of vias 174 being formed through dielectric layer 170 to facilitate subsequent electrical interconnection with LGA pads 190. In other instances, one or more layers of support material 148, such as dielectric layer 150, 170 may comprise holes, vias, or openings through the polymer or polyimide (non-encapsulant layers) so that layers of encapsulant 180 can interlock or connect through the openings and through the dielectric layer 150, 170 to improve mechanical connection.

Figure 4B:
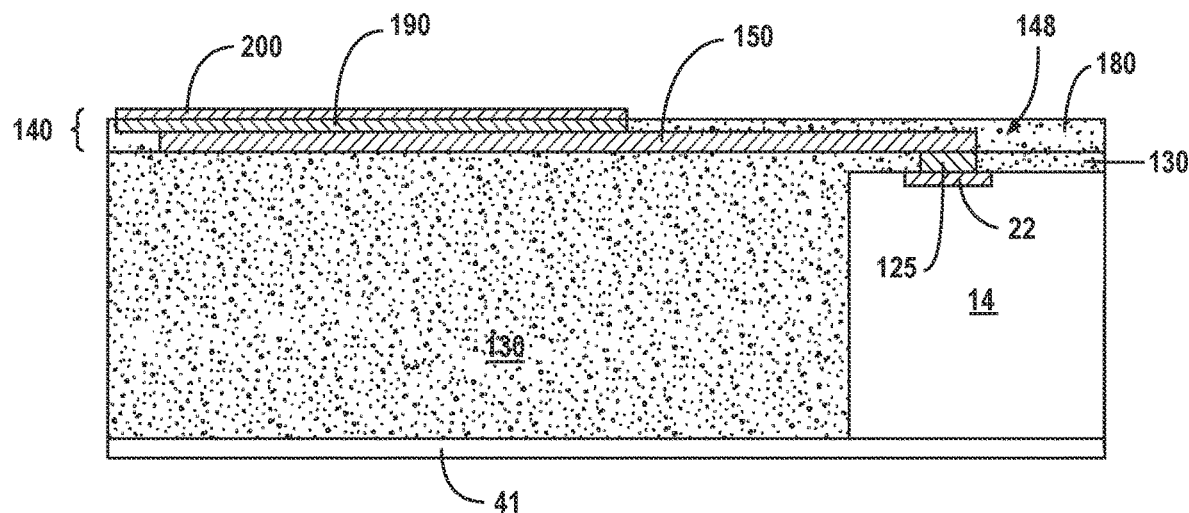
Figure 4C:
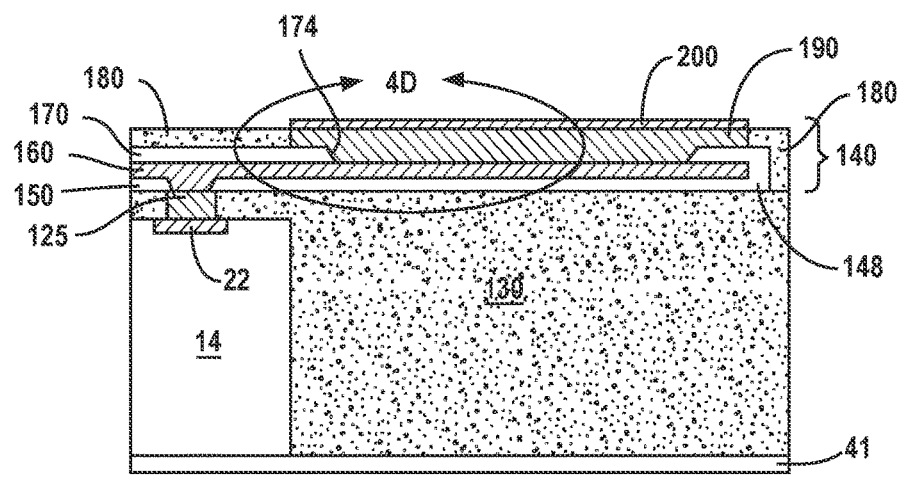
Figure 4D:
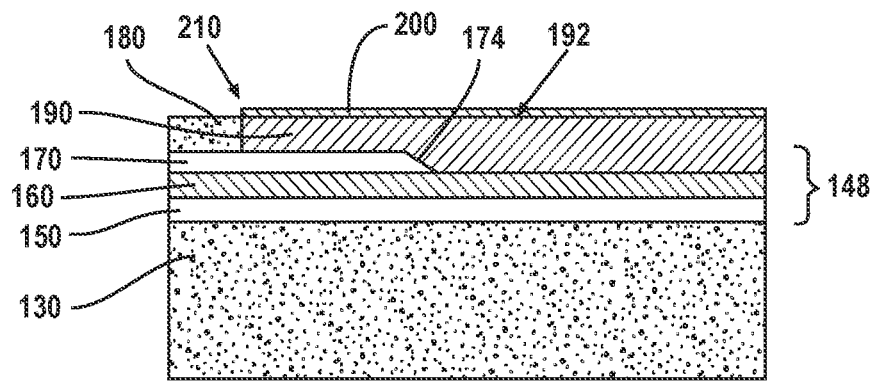
Figure 4E:
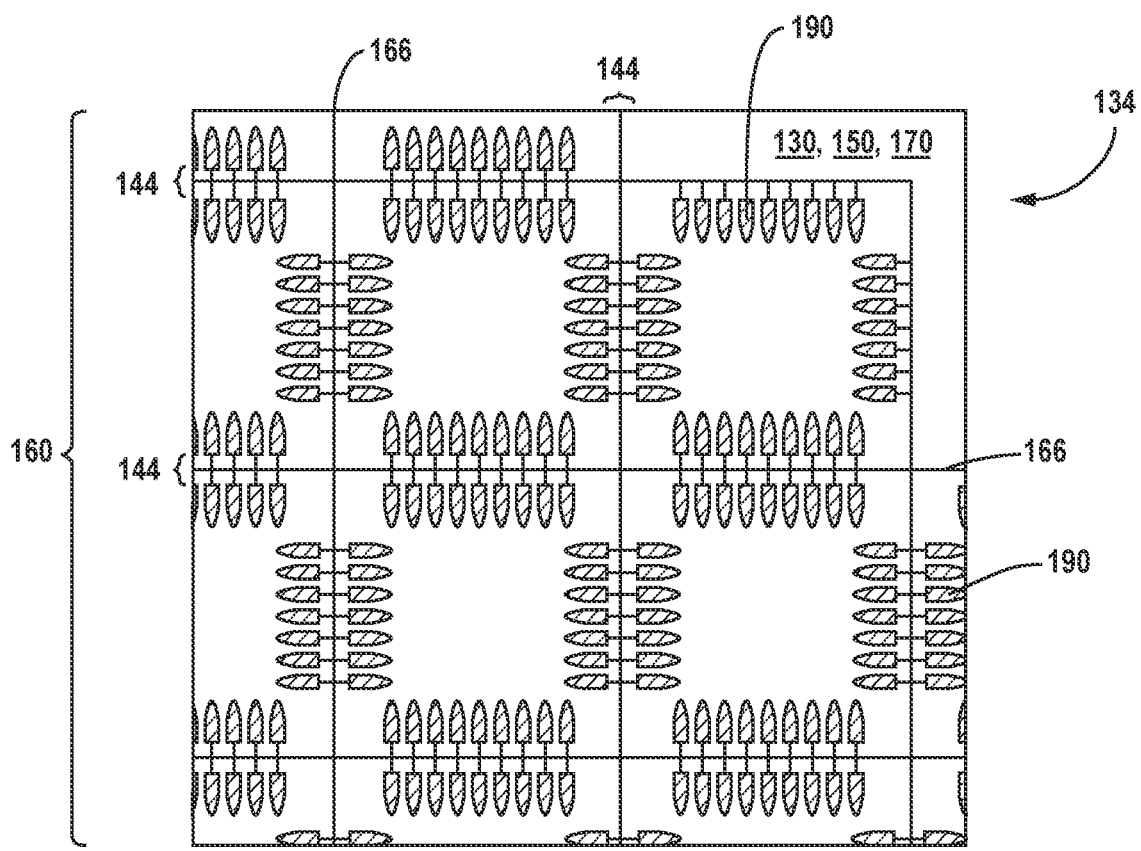

FIG. 4B illustrates a close-up view of FIG. 4A taken at detail marker 4B. FIG. 4B is illustrative of the process occurring over the entire chip packaging process and is not limited to the representative section illustrated in the following figures. FIG. 4B illustrates an instance in which polymer layers are not used around and contacting conductive layer 160, and instead only mold compound or encapsulant 130, 180 is used around and contacting conductive layer 160. Parts like QFNs, may benefit from using only mold compound 130, 180 and no polymer layers 150, 170, because the dielectric properties of the mold compound 130, 180 are sufficient for device performance, such as lengths of wirebonds 538 being short with low inductance (and little or no meaningful inductance from leads external to the body). Similarly, assemblies or components 300 may benefit from using only mold compound 130, 180 and no polymer layers 150, 170, because with short RDLs 163 and traces 164 that connect to LGA pads 190 that in turn connect directly to PCB and provide low inductance paths. In some instances, the encapsulant or mold compound 130, 180 may be the same or similar material as each other and the same or similar to the carrier 120. The encapsulant or mold compound 180, like encapsulant 42, can be deposited using a paste printing, compression molding, transfer molding, liquid encapsulant molding, lamination, vacuum lamination, spin coating, or other suitable application method. The encapsulant or mold compound 180 can be a polymer composite material, such as epoxy resin with filler, epoxy acrylate with filler, or polymer with or without filler. In some instances, the encapsulant 180 can be the same or similar as the encapsulant 130, or 142 that is used in forming embedded semiconductor die or other components 14.

FIG. 4C, similar to the view shown in FIG. 4B, illustrates the support material 148 formed as dielectrics 150, 170 disposed at least partially around the conductive layer 160, which may include RDLs 162 and traces 164. Whether the support material 148 comprises dielectric 150, 170 or not, a surface of the second encapsulant 180 and the LGA pads 190 can be planarized to form an upper encapsulant surface 182 and attachment areas 192. The plurality of attachment areas 192 may be coplanar or recessed within about 2 micrometers (μm) or less, about 1 μm or less, about 500 nanometers (nm) or less, or about 200 nm or less from the upper encapsulant surface 182 of the second encapsulant 180 to form the encapsulant-defined LGA pads 190 comprising the attachment areas 192. A perspective view showing top surfaces of the encapsulant defined LGAs are shown, e.g., in FIGS. 6A-6E.

FIG. 4D illustrates a close-up view of FIG. 4C taken at detail marker 4D, a shows additional detail of a solderable metal system (SMS) or OSP 200 over the plurality of attachment areas 192 after planarizing the surface of the second encapsulant 180. The SMS 200, such as tin or other solderable material, may be formed over the LGA pad 190. The SMS may be formed by, electroplating, electroless plating, immersion plating, physical vapor deposition (PVD), chemical vapor deposition (CVD), screen printing, or dipping of conductive materials over the conductive pads. When electroplating, the RDL 160 (or other desirable conductive layer) may be electrified to plate the SMS 200. In some instances, another photoresist could be used in the placement of the SMS 200. The SMS 200 may be formed by a single layer of material or multi-material layer build-up of conductive material comprising one or more layers of nickel (Ni), a layer of silver (Ag), a layer of palladium (Pd), a layer of tin (Sn), and a layer of gold (Au).

In other instances, instead of an SMS 200, an organic solderability preservative (OSP) 200 may be formed over the attachment areas 192 to resist oxidation. Use and placement of the OSP 200 may simplify a manufacturing process because OSP 200 may be formed with no photomask, and without electrifying a conductive layer, such as RDL 160 and LGA pad 190. Chemically the OSP 200 bonds with the copper or conductive material of the attachment areas 192, which can provide large cost savings (on the order of 10-15%, over the formation of an SMS 200). Before forming the OSP 20, the copper of the attachment areas 192 may undergo an etch process to clean the copper, after which the assembly may be put it in bath, in which the OSP 200 bonds with the exposed copper of the attachment areas 192 and may form a monolayer of carbon-bearing OSP 200. The encapsulant 180 and other material may remain unaffected as the OSP 200 bonds only with the exposed copper or conductive material of the LGA pad 190.

FIG. 4D, shows an enlarged view of a portion of an encapsulant-defined LGA pad 190, covered with SMS or OSP 200, wherein the SMS or OSP 200 is formed over the attachment area after a grinding step, so as to form a step or offset 210 between the top or upper surface 182 of the second encapsulant 180 and the top or upper surface 202 of the SMS or OSP 200. The step or offset 210 may comprise a height or distance of about 0-5 μm, 0.1-2.5 μm, or about 2 μm or less.

FIG. 4E illustrates a plan view or top view, taken transverse or perpendicular to the cross-sectional side views of FIGS. 4A-4D, in which the conductive layer 160 is formed as an RDL 162 over the encapsulant 130 of the reconstituted wafer 134, which may also be used as an electroplating bus, such as for forming the LGA pads 190, the SMS 200, or both.

Figure 4F:
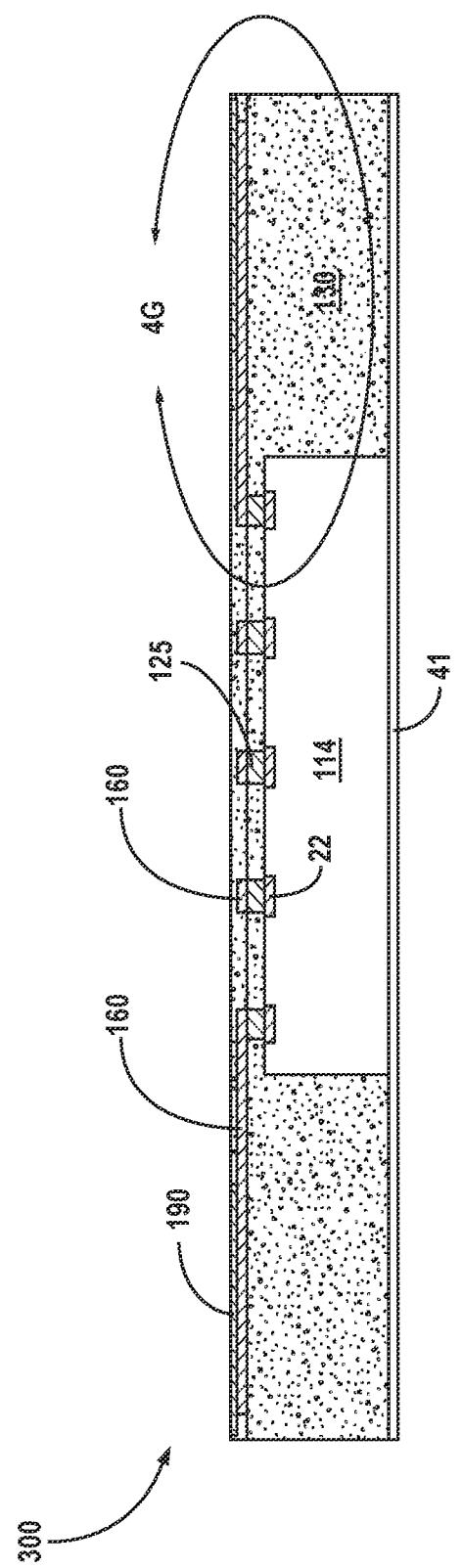

FIG. 4F, similar to FIG. 4A, illustrates an embedded component 14 or 114 within the reconstituted panel 134. FIG. 4F differs from FIG. 4A in that no SMS or OSP 200 has been yet formed over the attachment area 192 of the LGA pad 190.

Figure 4G:
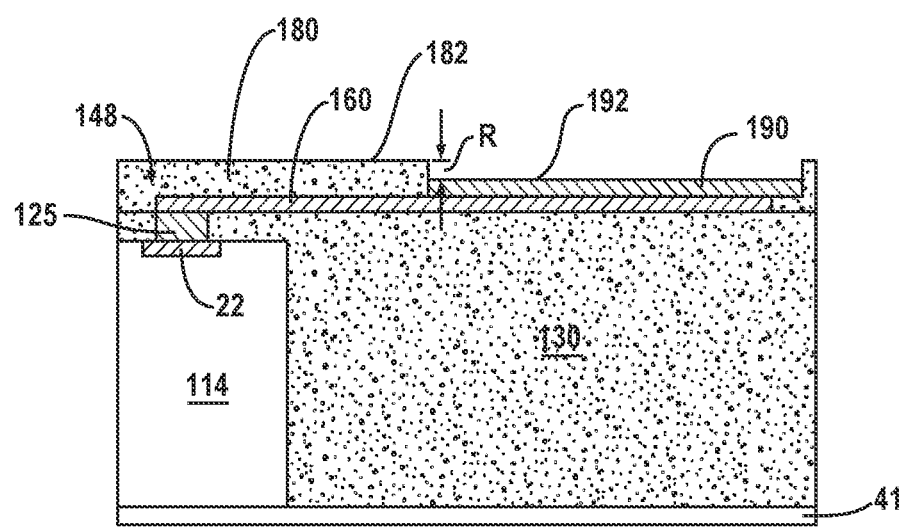

FIG. 4G illustrates a close-up view of the attachment area 192 of the LGA pads 190. After planarizing of the second encapsulant 180 and of the LGA pad 190, the reconstituted panel 134 can undergo an etching process to remove undesired metallic or copper residue from the upper surface 182 of the encapsulant 180. The etching process can also remove a portion of the LGA pad 190 and reduce a height or lower a level of the attachment area 192 of the LGA pad 190 to create a recess or offset R with respect to the upper surface 182 of the second encapsulant 180. A distance or height of the recess R can be within a range of about 3 μm or less, 2 μm or less, about 1 μm or less, about 500 nm or less, or about 200 nm or less.

Figure 5A:
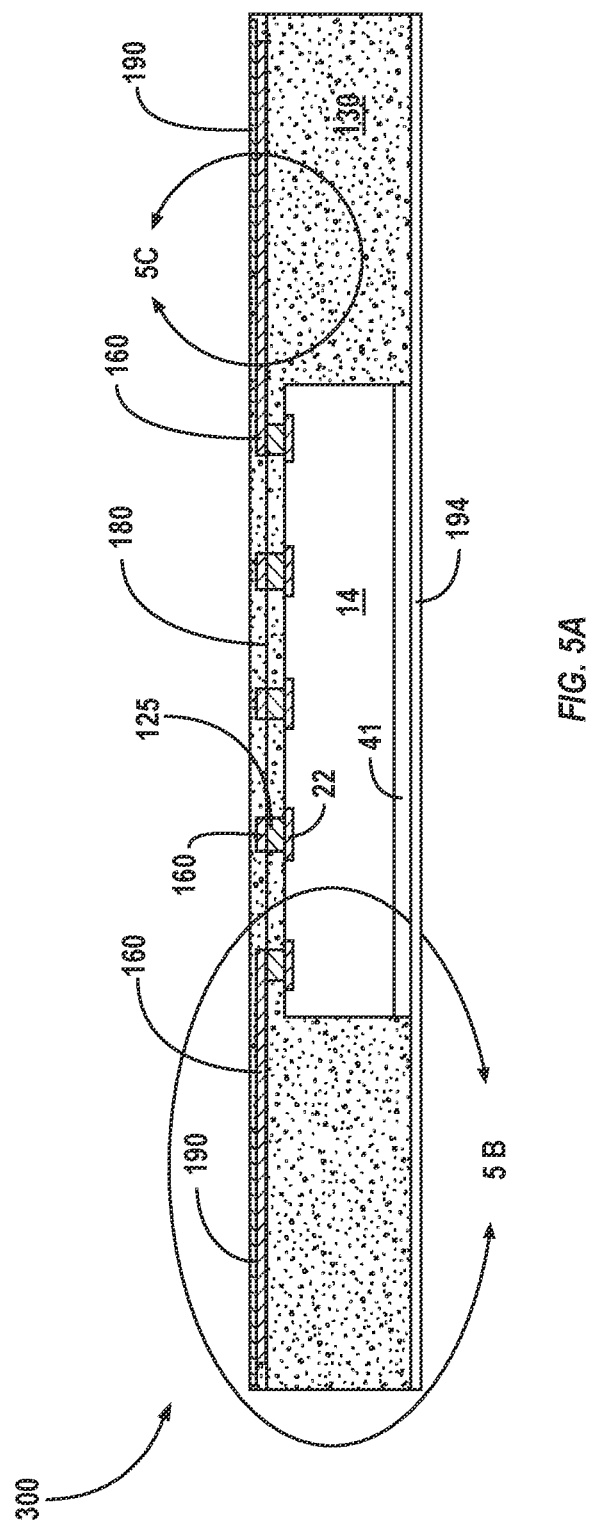
FIGS. 5A-5C illustrate another aspect of encapsulant defined LGAs.

FIG. 5A, similar to FIG. 4A, illustrates another variation in which forming of the SMS 200 (such as by plating) occurs before planarizing the upper surface 182 of the second encapsulant 180 and the LGA pads 190 to form an upper encapsulant surface 182 and attachment areas 192. In this instance, the SMS 200 is formed as part of the LGA pad 190, and upon grinding, the SMS 200 becomes the attachment surface 192 of the encapsulant defined LGA pad 190.

Figure 5B:
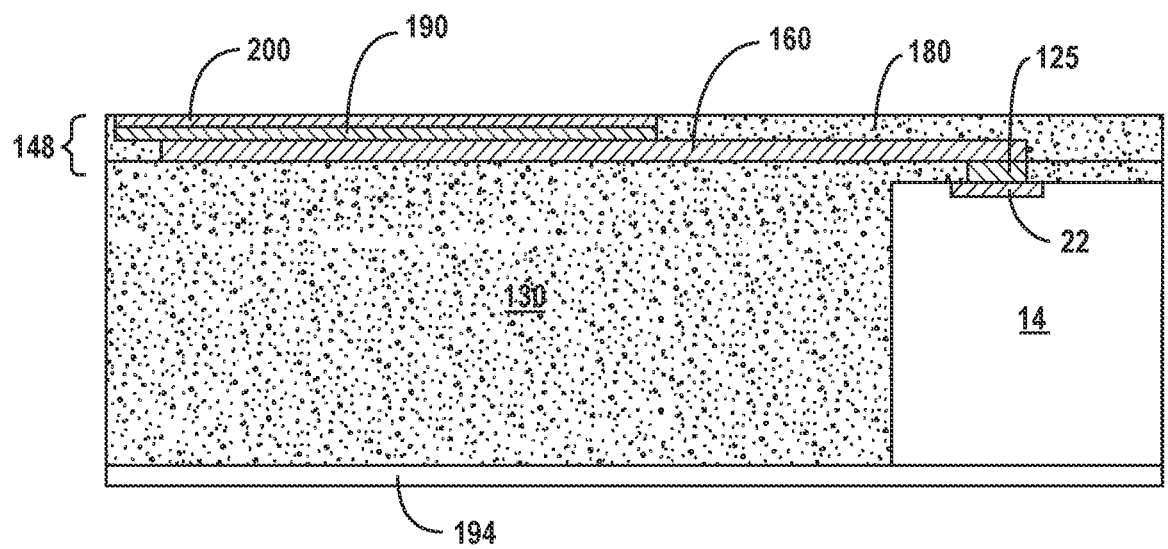

FIG. 5B illustrates a close-up view of FIG. 5A taken at detail marker 5B. FIG. 5B is illustrative of the process occurring over the entire chip packaging and is not limited to the representative section illustrated in the following figures. While FIG. 5B is shown with encapsulants 130 and 180 and without separate dielectric layers 150, 170 like was shown in FIGS. 4C, a POSA will appreciate that any of the aspects or embodiments included (or that are illustrated in FIG. 5B) may also include one or more layers of dielectric 150, 170 or any desired support material.

Figure 5C:
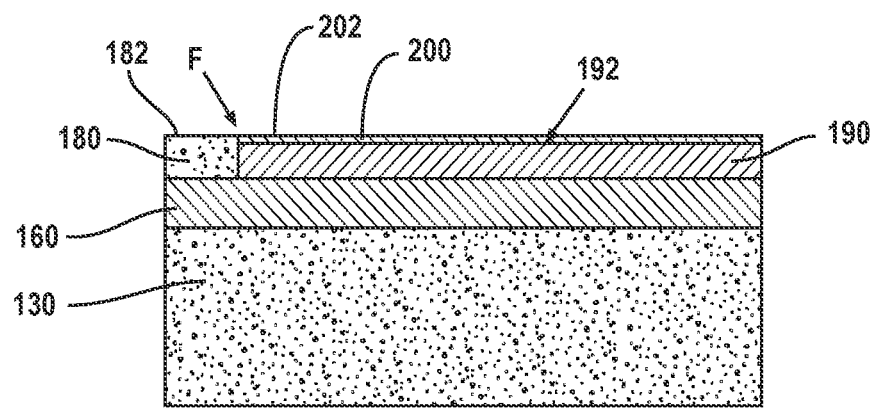

FIG. 5C, shows an enlarged view of FIG. 5A taken at detail marker 5C, and shows a portion of an encapsulant defined LGA pad 190. FIG. 5C illustrates that there is no step, offset, or recess R between the upper surface 182 of the second encapsulant 180 and the SMS 200 of the encapsulant defined LGA pad 190, as the SMS 200 is exposed by a grind reveal.

Figure 6A:
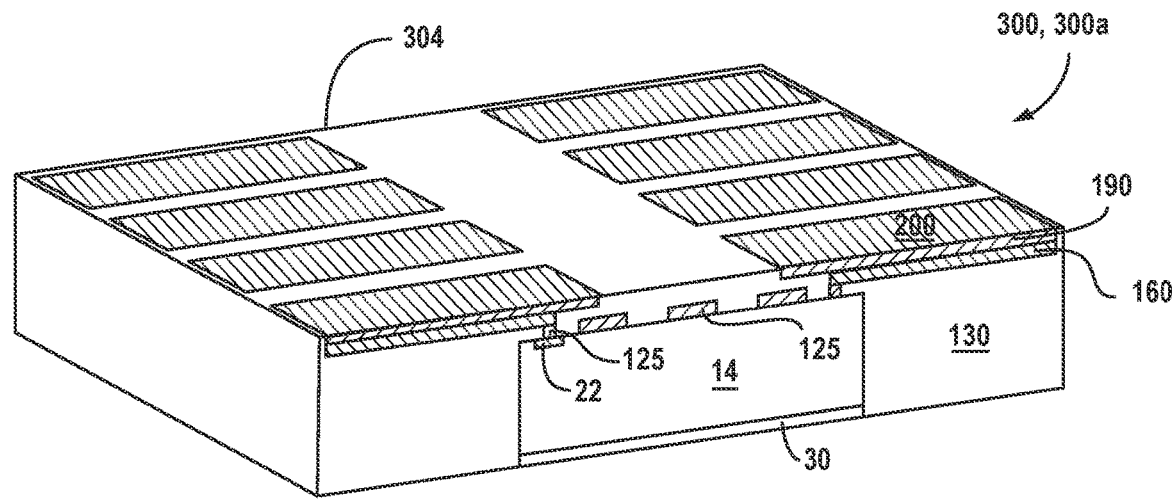
FIGS. 6A-6K illustrate various assemblies comprising encapsulant defined LGAs.

FIGS. 6A-6E. illustrate various perspective views showing assemblies or packages 300 comprising encapsulant defined LGA pads 190. Top surfaces 192 of the LGA pads 190, may be further covered in SMS or OSP 200. FIG. 6A illustrates an assembly or package 300a comprising a component 14 within the encapsulant 130 and encapsulant defined LGA structures 190 covered with SMS 200 that are formed with large rectangular shapes at the top or upper surface of the assembly and comprise an offset from the assembly or package edge 304.

Figure 6B:
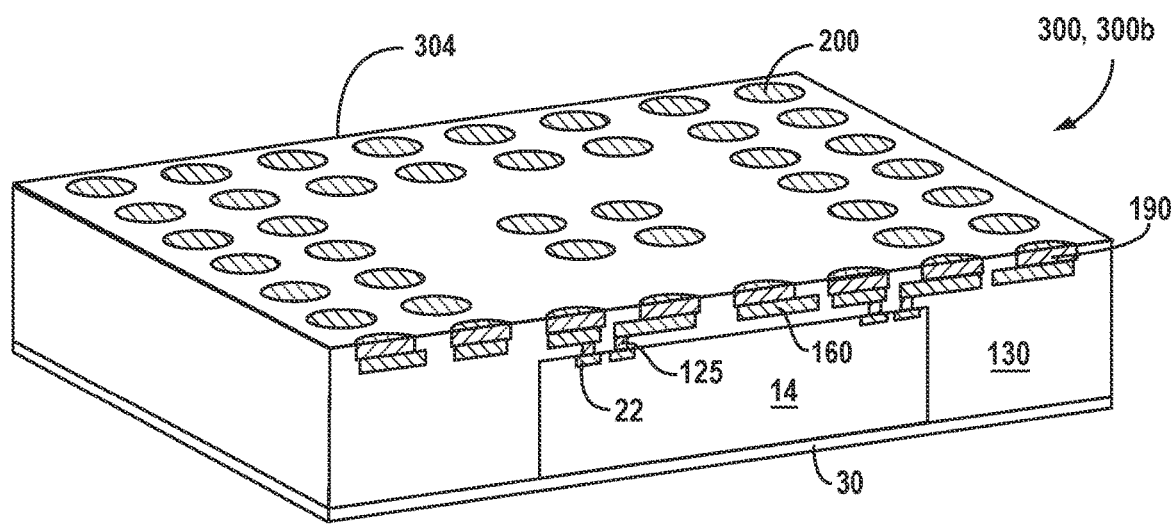

FIG. 6B, similar to FIG. 6A, illustrates an assembly or package 300b comprising a component 14 or 114 within the encapsulant 130 and encapsulant defined LGA pads 190 comprising circular shapes covered with SMS 200 at the top or upper surface of the assembly 300b.

Figure 6C:
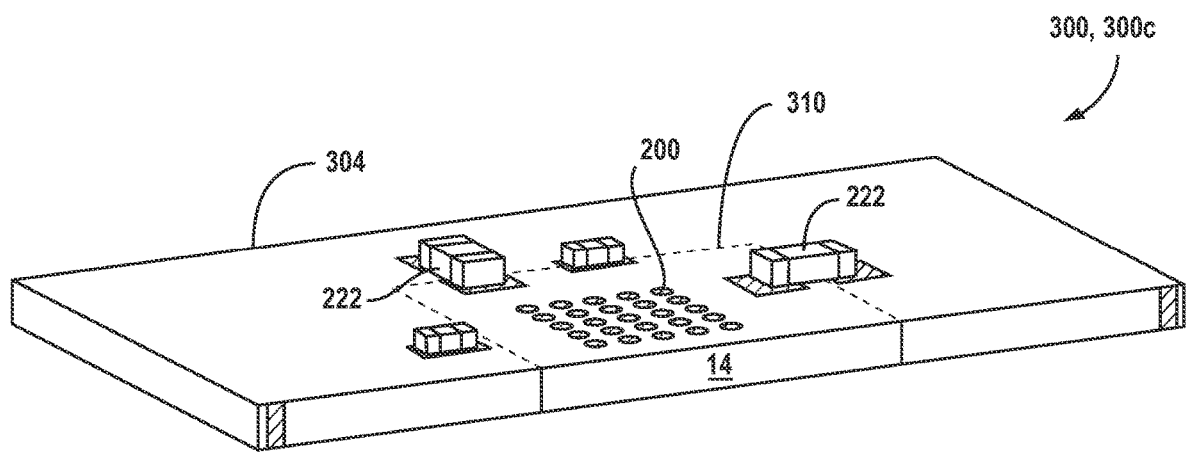

FIG. 6C, similar to FIGS. 6A and 6B, illustrates an assembly or package 300c comprising a component 14 or 114 within the encapsulant 130 and encapsulant defined LGA pads 190 comprising circular shapes at the top or upper surface of the assembly 300c. FIG. 6C further shows another level of assembly that forms a 3D structure. The 3D structure comprises surface mount devices (SMDs) 222, which could be actives, passives, or both. As shown at the right of FIG. 6C, a SMD or passive 22 is disposed over and extends across the component shadow or footprint 310 of component 14. The SMDs 222 are supported and do not have structural, or reliability problems given the strength and utility of the current design with mounted components or SMDs 222 straddling or crossing the shadow 310 of the embedded component 14. As such, the illustrated structure provides greater design flexibility and improves upon the limitation of conventional fan out structures that have reliability and performance problems when the SMDs 150 cross the component shadow 310. FIG. 6C also illustrates forming at least one of a through mold post and a double-sided circuit trace in the assembly.

Figure 6D:
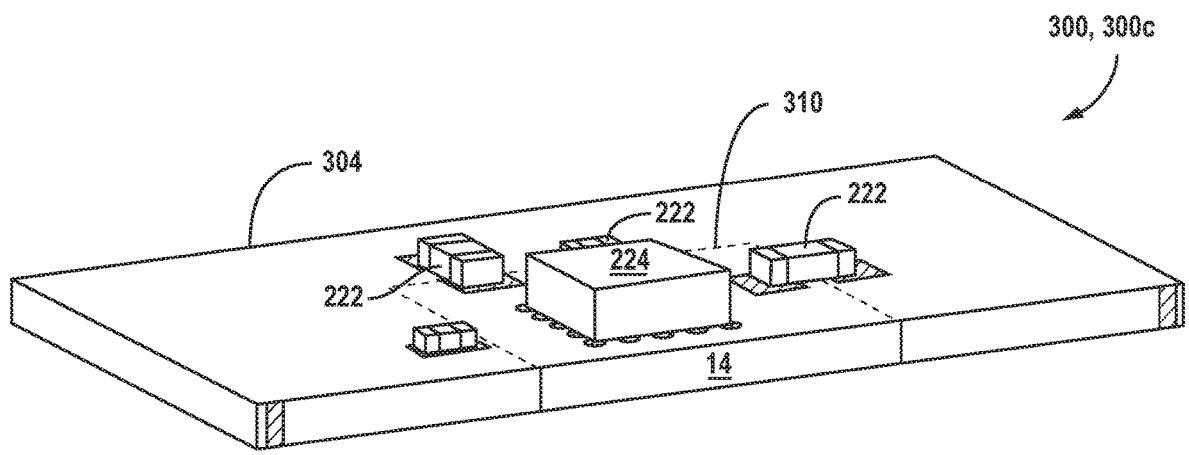

FIG. 6D, similar to FIG. 6C, differs from FIG. 6C by including an additional as well as chip or component 224 disposed over and coupled to the centrally located encapsulant defined LGA pads 200 with circular shapes.

Figure 6E:
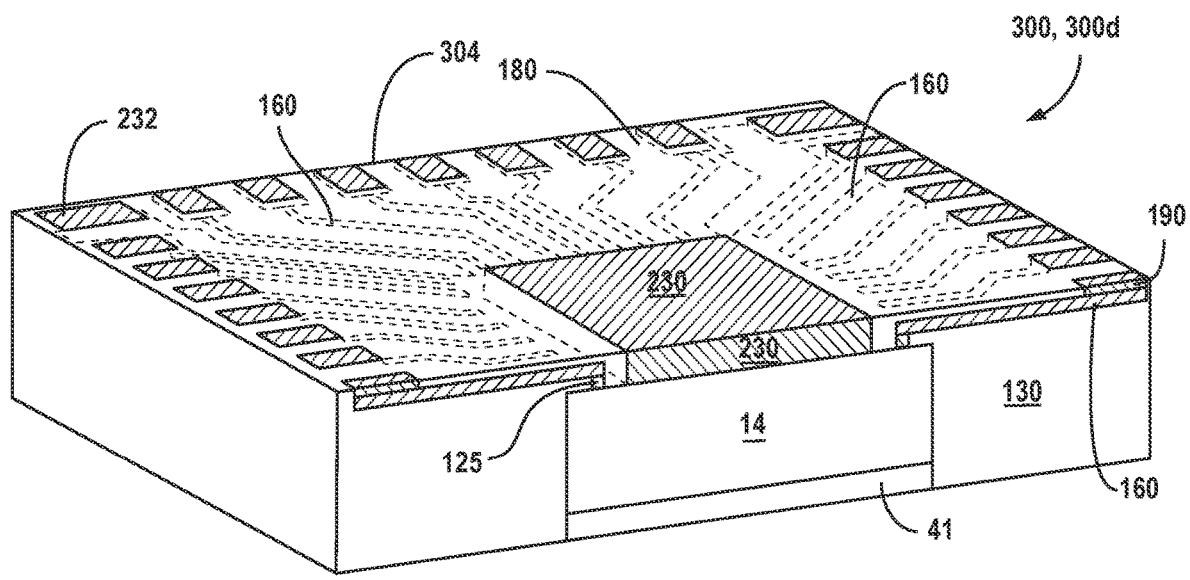

FIG. 6E, similar to FIG. 6A, provides a cutaway view of an interior of the assembly 300, 300d and shows an embedded component 14 therein. FIG. 6E differs from FIG. 6A by the inclusion of a flag 230 at a surface of the assembly. Like FIG. 6A, FIG. 6E illustrates encapsulant-defined LGA pads 190 that may be covered with SMS 200, wherein the LGA pads 190 are formed with rectangular shapes at the top or upper surface of the assembly 300d. FIG. 6E further provides a situation in which the conductive layer 160 or the LGA pads 190 may be formed using unit specific patterning (also known under the trademark Adaptive Patterning) or laser direct imaging (LDI). As such, an alignment between the conductive layer 160 and the conductive studs 125 of the component 14 will be consistently or universally greater than an alignment between the component 14 and a package edge 304.

Figure 6F:
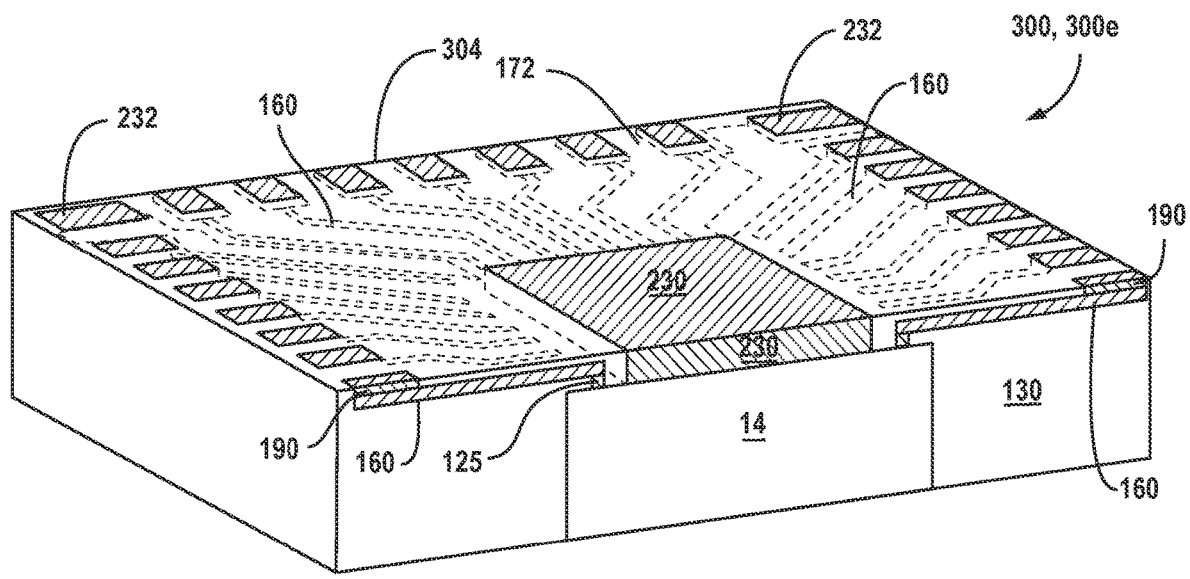

FIG. 6F, similar to FIG. 6E, provides an isometric view of the assembly or package 300e, which differs from assembly or package 330d of FIG. 6A by omitting optional adhesive or DAF 41. FIG. 6F also differs from FIG. 6E by including polyimide, polymer, or dielectric material 172 around and defining the LGA pads 190 rather than using the second encapsulant 180.

Figure 6G:
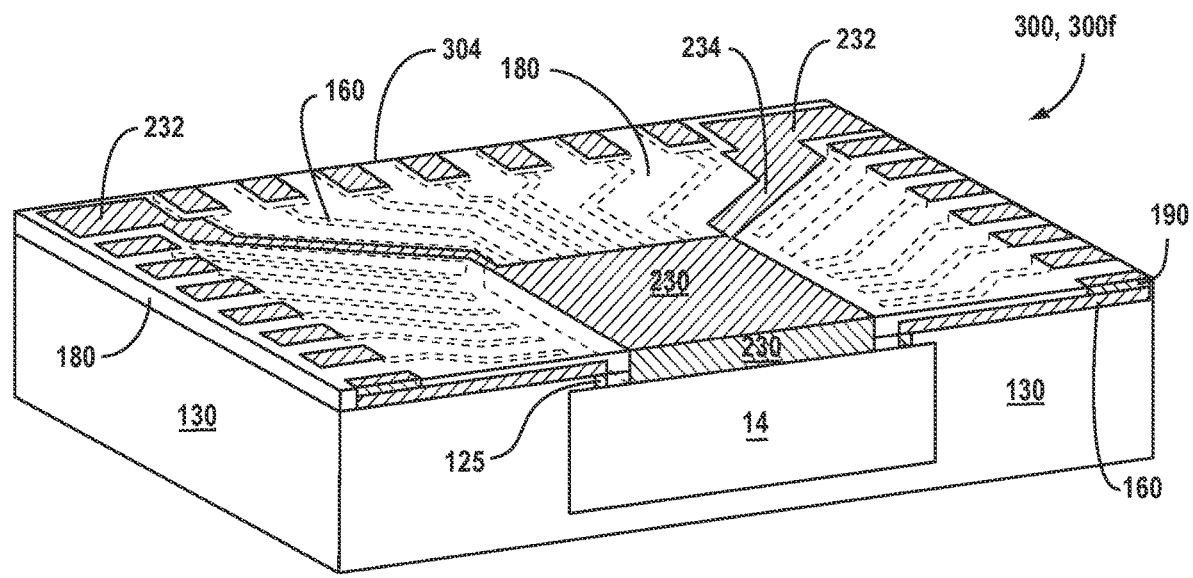

FIG. 6G provides an isometric view of the assembly or package 300f similar to the other assemblies or packages 300 shown in FIGS. 6A-6F. However, assembly or package 300f differs from the other assemblies or packages 300 by including corner flags 232 that are coupled to the flag 230 with conductive connector 234 to provide greater surface area for heat dissipation. In FIG. 6G the flag 230, conductive connectors 234 and corner flags 232 are adjacent, contacting, supported by, and may be defined by, second encapsulant 180.

Figure 6H:
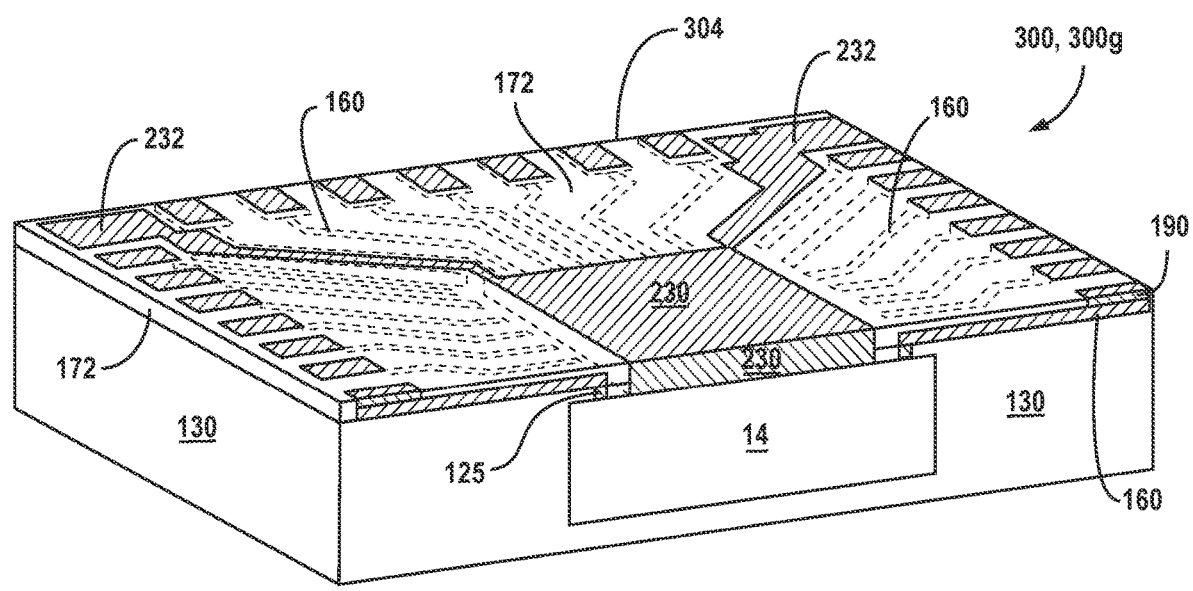

FIG. 6H, provides an isometric view of the assembly or package 300g similar to the assembly or package 300f shown in FIG. 6G. However, assembly or package 300g differs from the assembly or package 300f by using polyimide, polymer, or dielectric layer 172 (instead of second encapsulant 180) adjacent, contacting, supported by, and to define one or more of the LGA pads 190, the flag 230, the conductive connectors 234, and the corner flags 232

Figure 6I:
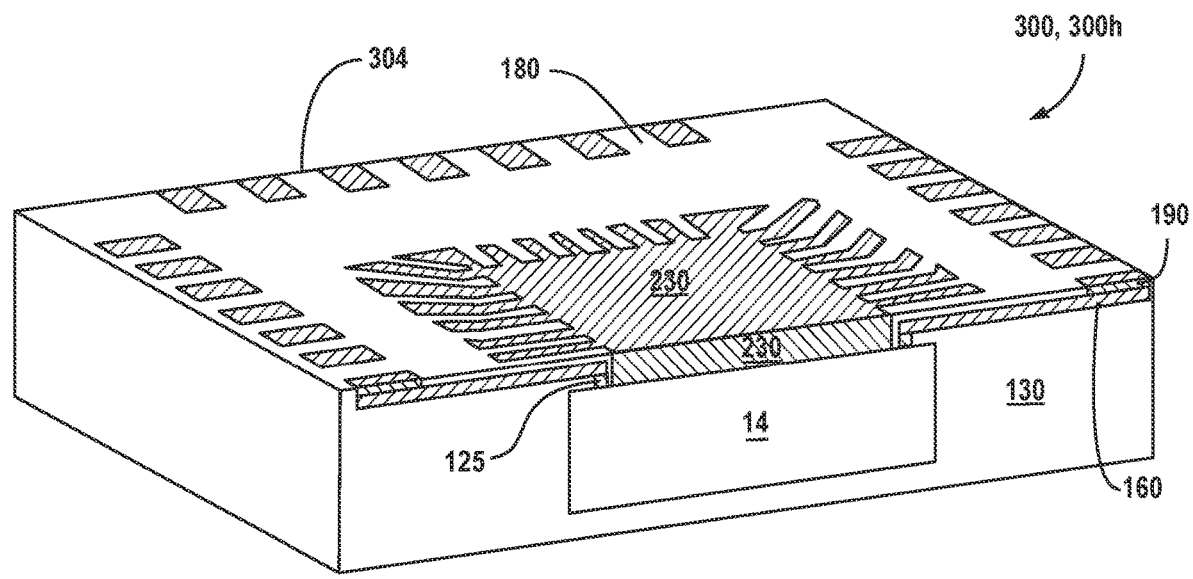

FIG. 6I provides an isometric view of the assembly or package 300h similar to the assembly or package 300d shown in FIG. 6E. However, assembly or package 300h differs from the assembly or package 300f by including a modified flag 230. The modified flag 230 comprises a crenelated perimeter, outline, or footprint that comprises a number of fingers or ridges extending from and an inner edge or inner perimeter of the flag 230 to an outer edge or outer perimeter. FIG. 6I further illustrates an instance in which the second encapsulant 180 is disposed around the flag 230 and the LGA pads 190. By forming the flag 230 with the crenelated perimeter, a surface area of the flag 230 may increase, and a corresponding increase in heat dissipation can also be achieved.

Figure 6J:
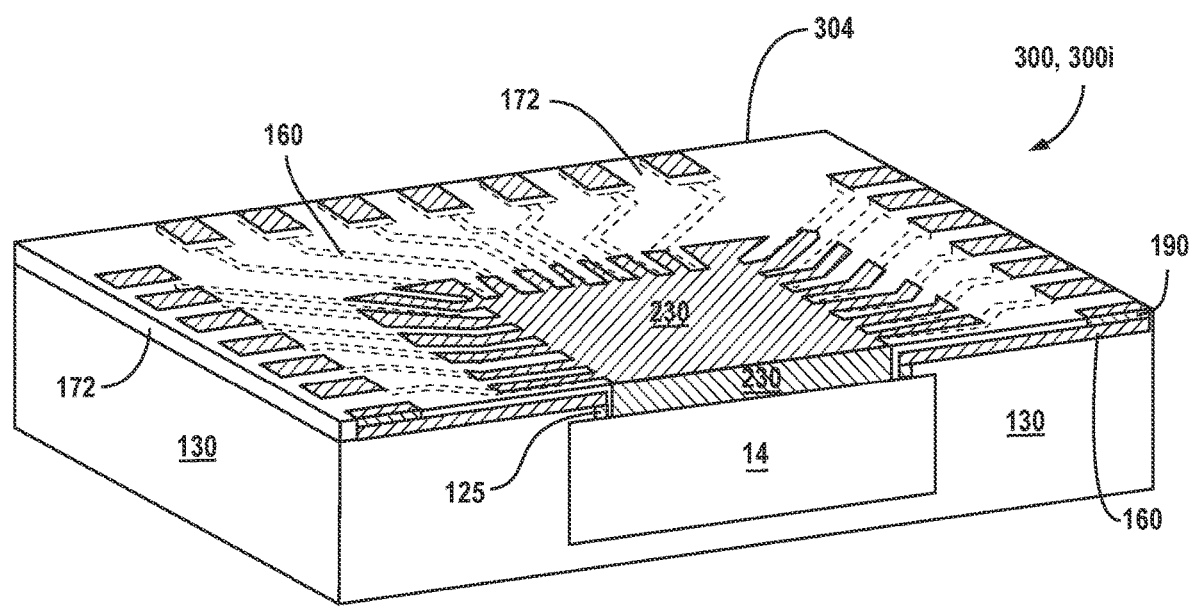

FIG. 6J, illustrates an assembly or package 300i similar to the assembly or package 300h shown in FIG. 6I. However, assembly or package 300i differs from the assembly or package 300h by including polyimide, polymer, or dielectric layer 172 (instead of second encapsulant 180) disposed around the flag 230 and the LGA pads 190. Polyimide layer 172 is also represented as being at least partially transparent such that paths of electrically conductive layer 160 can be seen through the polyimide layer 172. As such, the traces 164 or conductive layer 160 can be seen interleaved with the crenelated perimeter of the flag 230, to prevent contact and electrical shorting, without a need to create multiple conductive layers 160 over one another as part of a multi-layer build-up interconnect structure.

Figure 6K:
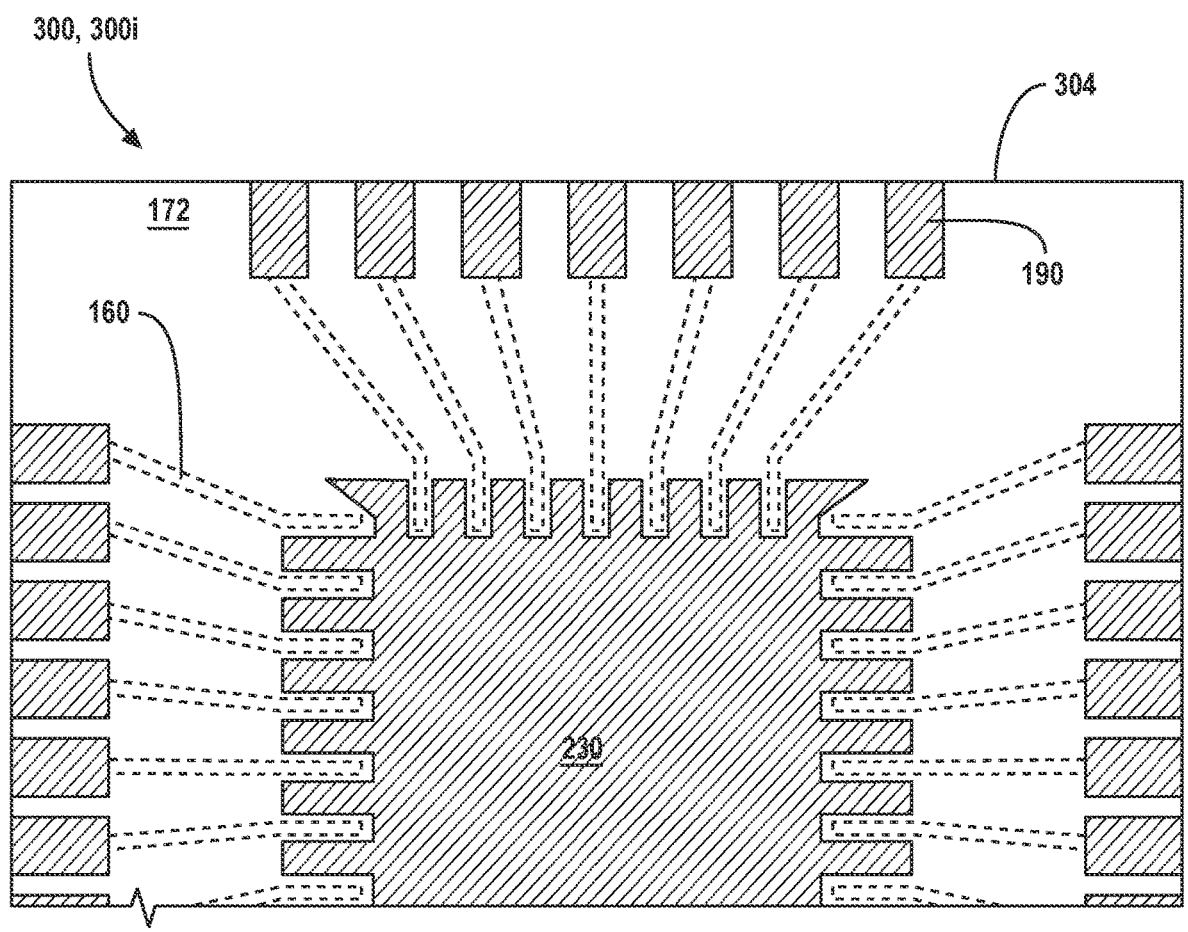

FIG. 6K, includes plan view of the assembly or package 300i from FIG. 6J that further illustrates the traces 164 or conductive layer 160 can be interleaved with the crenelated perimeter of the flag 230; which prevents contact and electrical shorting between the conductive layer 160 and the flag 230, without a need to create multiple conductive layers 160 over one another as part of a multi-layer build-up interconnect structure. The irregular perimeter of flag 230 comprising indentations and fingers to increase a surface are of the flag 230 allows portions of the flag to extend outside or beyond the footprint 310 of the component 14. The POSA will appreciate that the crenelated flag 230 may be present in any of the other illustrated embodiments, including in instances where the conductive connectors 234 and corner flags 232 are present.

In other instances, more than one conductive layer 160 may be present in the fan out interconnect structure 140. The conductive layer may be formed of multiple conductive layers and support or insulating layers being disposed over the substrate or carrier, such as three insulating layers and two conductive layers. While the barrier layer or adhesion layer and seed layers are not shown in the FIGS. the POSA will appreciate that any desired number of layers may be formed according to the configuration and design of the final product. The conductive layers 160 may comprise traces 164 for subsequent vertical or through component connections, and may be formed to comprise one or more of a capacitor, inductor, shielding, resistor, antenna or antenna feed, or other feature.

While this disclosure includes a number of embodiments in different forms, there is presented in the drawings and written descriptions in the following pages detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other structures, manufacturing devices, and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art. As such, it will be evident that various modifications and changes may be made thereto without departing from the broader spirit and scope of the inventions as set forth in the appended claims. The specification and drawings are, accordingly, to be regarded in an illustrative sense rather than a restrictive sense.

What is claimed is:

1. A method of making an assembly or package comprising an encapsulant-defined land grid array (LGA), comprising:
   disposing a semiconductor chip face-up on a temporary carrier, the semiconductor chip comprising conductive studs over an active layer of the semiconductor chip;
   disposing a first encapsulant in a single step around at least four side surfaces of the semiconductor chip, over the active layer of the semiconductor chip, and around at least a portion of sidewalls of the conductive studs;
   planarizing a surface of the first encapsulant and conductive studs;
   forming conductive traces over the first encapsulant and coupled with the conductive studs;
   forming a dielectric layer adjacent the conductive traces;
   forming land grid array (LGA) pads coupled with the conductive traces;
   disposing a second encapsulant over the dielectric layer and the LGA pads; and
   planarizing a surface of the second encapsulant and the LGA pads to form an upper encapsulant surface and a plurality of attachment areas,
   wherein the plurality of attachment areas is coplanar or recessed within 2 micrometers of the upper encapsulant surface to form the encapsulant-defined LGA from the plurality of attachment areas.

2. The method of claim 1, wherein the dielectric layer comprises one or more organic material, an inorganic material, and a polymer such as polyimide.

3. The method of claim 1, wherein an offset of 2 micrometers or less between the plurality of attachment areas and the upper encapsulant surface results from an etching process.

4. The method of claim 1, further comprising forming a solderable metal system (SMS) or an organic solderability preservative (OSP) over the plurality of attachment areas either before or after planarizing the surface of the second encapsulant.

5. The method of claim 1, wherein a conductive layer comprises one or more of the conductive traces and a flag.

6. The method of claim 5, wherein the flag comprises an irregular perimeter with indentations and fingers to increase a surface area of the flag that extends outside a footprint of the semiconductor chip.

7. The method of claim 5, wherein the conductive layer comprises corner flags and conductive connectors configured to provide greater heat dissipation than a conductive layer without corner flags and conductive connectors.

8. The method of claim 1, wherein the first encapsulant and the second encapsulant comprise a same material.

9. The method of claim 1, further comprising forming at least one of a through mold post and a double-sided circuit trace in the assembly.

10. The method of claim 1, further comprising mounting a component over the encapsulant-defined LGA to form a three dimensional (3D) assembly, wherein the mounted component crosses a shadow of the semiconductor chip.

11. The method of claim 1, further comprising forming a conductive layer or the LGA pads using adaptive patterning or laser direct imaging (LDI).

12. A method of making an assembly or package comprising an encapsulant-defined land grid array (LGA), comprising:
   providing a component comprising conductive studs;
   forming conductive traces coupled with the conductive studs;
   forming a plurality of LGA pads coupled with the conductive traces over a first encapsulant;
   forming a dielectric layer adjacent the conductive traces and disposing a second encapsulant over the dielectric layer and the plurality of LGA pads;
   removing a portion of the second encapsulant from over the plurality of LGA pads to form a plurality of attachment areas and an upper encapsulant surface; and
   wherein the plurality of attachment areas is substantially coplanar or recessed within 2 micrometers of the upper encapsulant surface to form a plurality of encapsulant-defined LGA pads.

13. The method of claim 12, further comprising forming a solderable metal system (SMS) or an organic solderability preservative (OSP) over the plurality of attachment areas either before or after removing a portion of the second encapsulant from over the plurality of LGA pads to form the plurality of attachment areas.

14. The method of claim 12, further comprising forming dielectric layers on at least two sides of the conductive traces.

15. The method of claim 12, further comprising forming one or more dielectric layers adjacent the conductive traces, wherein the one or more dielectric layers comprises one or more organic material, an inorganic material, and a polymer such as polyimide (PI).

16. The method of claim 12, further comprising forming at least a portion of a conductive layer, including the plurality of LGA pads, using adaptive patterning or laser direct imaging (LDI).

17. The method of claim 12, wherein an offset of 2 micrometers or less between the plurality of attachment areas and the upper encapsulant surface results from an etching process.

18. The method of claim 12, wherein a conductive layer comprises a first conductive trace, of the conductive traces, and a flag, wherein the first conductive trace is electrically isolated from the flag.

19. The method of claim 18, wherein the conductive layer comprises corner flags and conductive connectors configured to provide greater heat dissipation than a conductive layer without corner flags and conductive connectors.

20. A method of making an assembly or package comprising an encapsulant-defined land grid array (LGA), comprising:
   providing a component comprising conductive studs;
   forming conductive traces coupled with the conductive studs;
   forming a plurality of LGA pads coupled with the conductive traces; and
   removing a portion of a second encapsulant from over the plurality of LGA pads to form a plurality of attachment areas and an upper encapsulant surface;
   wherein the plurality of attachment areas is substantially coplanar or recessed within 2 micrometers of the upper encapsulant surface to form a plurality of encapsulant-defined LGA pads;

wherein a conductive layer comprises a first conductive trace, of the conductive traces, and a flag, wherein the first conductive trace is electrically isolated from the flag, the flag comprises an irregular perimeter with indentations and fingers to increase a surface area of the flag that extends outside a footprint of the component, and at least a portion of the conductive trace is disposed within an indentation of the irregular perimeter of the flag.

21. The method of claim 20, further comprising forming a solderable metal system (SMS) or an organic solderability preservative (OSP) over the plurality of attachment areas either before or after removing the portion of the second encapsulant from over the plurality of LGA pads to form the plurality of attachment areas.

22. The method of claim 20, further comprising forming dielectric layers on at least two sides of the conductive traces.

* * * * *